US010456878B2

(12) United States Patent
Gosselin et al.

(10) Patent No.: US 10,456,878 B2
(45) Date of Patent: Oct. 29, 2019

(54) EQUIPMENT CABINET AND ASSOCIATED METHODS

(71) Applicant: Ortronics, Inc., New London, CT (US)

(72) Inventors: Daniel Gosselin, Harrisville, RI (US); Todd P. Schneider, Monroe, CT (US)

(73) Assignee: Ortronics, Inc., New London, CT (US)

( * ) Notice: Subject to any disclaimer, the term of this patent is extended or adjusted under 35 U.S.C. 154(b) by 541 days.

(21) Appl. No.: 15/094,047

(22) Filed: Apr. 8, 2016

(65) Prior Publication Data

US 2016/0302323 A1 Oct. 13, 2016

Related U.S. Application Data

(60) Provisional application No. 62/145,063, filed on Apr. 9, 2015.

(51) Int. Cl.
| | |
|---|---|
| *B23P 19/04* | (2006.01) |
| *H05K 7/14* | (2006.01) |
| *H05K 7/18* | (2006.01) |
| *H05K 7/20* | (2006.01) |

(52) U.S. Cl.
CPC ............ *B23P 19/04* (2013.01); *H05K 7/1488* (2013.01); *H05K 7/186* (2013.01); *H05K 7/20572* (2013.01); *H05K 7/20736* (2013.01)

(58) Field of Classification Search
CPC ....... B23P 19/04; H05K 7/1488; H05K 7/186; H05K 7/20572; H05K 7/20736
USPC ........................................................ 454/184
See application file for complete search history.

(56) References Cited

U.S. PATENT DOCUMENTS

| | | | | |
|---|---|---|---|---|
| 7,542,287 B2* | 6/2009 | Lewis, II | ........... | H05K 7/20736 165/104.33 |
| 7,894,190 B2* | 2/2011 | Davis | ................. | H05K 7/20736 361/690 |
| 8,040,673 B2* | 10/2011 | Krietzman | ......... | H05K 7/20736 165/104.19 |
| 8,653,363 B2* | 2/2014 | Behrens | ............... | H05K 7/1488 174/17 VA |
| 2007/0064389 A1* | 3/2007 | Lewis, II | ........... | H05K 7/20745 361/690 |
| 2010/0248610 A1* | 9/2010 | Caveney | ............ | H05K 7/20745 454/184 |
| 2014/0011437 A1* | 1/2014 | Gosselin | ............ | H05K 7/20836 454/154 |

* cited by examiner

*Primary Examiner* — Gregory L Huson
*Assistant Examiner* — Dana K Tighe
(74) *Attorney, Agent, or Firm* — McCarter & English, LLP

(57) ABSTRACT

Exemplary embodiments are directed to equipment cabinets for customized improved cable management and airflow management. The equipment cabinets include a frame structure. The frame structure includes a top frame assembly and a bottom frame assembly. In some embodiments, the equipment cabinets include a chimney assembly. In some embodiments, the equipment cabinets include a slidable vertical rail. In some embodiments, the equipment cabinets include a rotatable top panel. In some embodiments, the equipment cabinets include a condition monitoring assembly. In some embodiments, the equipment cabinets include a reinforced corner construction. In some embodiments, the equipment cabinets include divider panels capable of being split. Embodiments are also directed to methods of equipment cabinet assembly.

16 Claims, 19 Drawing Sheets

EQUIPMENT CABINET AND ASSOCIATED METHODS

CROSS-REFERENCE TO RELATED APPLICATION(S)

The present application claims priority benefit to a provisional patent application entitled "Equipment Cabinet and Associated Methods," which was filed on Apr. 9, 2015, and assigned Ser. No. 62/145,063. The entire content of the foregoing provisional patent application is incorporated herein by reference.

TECHNICAL FIELD

The present disclosure relates to equipment cabinets and associated methods and, more particularly, to equipment cabinets that provide advanced airflow and cable management.

BACKGROUND

In general, commercial buildings require an effective and efficient telecommunications or data center infrastructure to support the wide variety of services that rely on the transport of information. Typically, wiring systems within buildings are terminated at a location where they may be interconnected with one another and/or to other cabling systems or telecommunications equipment. Cables are often terminated on wire panels or patch panels which can be mounted within cabinets or to some other location/structure.

In general, many rows of cabinets typically fill a data center or telecommunications room. Patch panels affixed to a cabinet and/or a wall of a telecommunications room provide convenient access to telecommunication devices (e.g., servers) within the cabinet or room. As the demand for the use of telecommunication devices grows, space for such devices becomes limited and/or expensive. In particular, the cabinets typically used in the telecommunications industry or in data centers offer limited variability in structure to accommodate different cable management needs. In addition, due to the growth in data center equipment stored in cabinets, an increase in heat emitted from the data center equipment occurs, requiring additional airflow management.

Thus, a need exists for equipment cabinets that provide improved variability for cable management and heat dissipation. These and other needs are addressed by the equipment cabinets and associated methods of the present disclosure.

SUMMARY

In accordance with embodiments of the present disclosure, exemplary equipment cabinets are provided that include a frame structure. The frame structure includes a top frame assembly and a bottom frame assembly. The equipment cabinets can include a chimney assembly. The chimney assembly can include a first section and a second section that define a passage therethrough. The first section of the chimney assembly can be mountable to the top frame assembly of the frame structure. The second section can be slidably movable relative to the first section to extend the passage formed by the first and second sections of the chimney assembly.

The chimney assembly can include a base section. The first section can be mountable to the top frame assembly with the base section. The first section of the chimney assembly can include a vertical guide defining a passage therein. A nut can be slidably disposed within the passage. The second section of the chimney assembly can include a fastener configured to mate with the nut of the first section to maintain a position of the second section relative to the first section. The second section of the chimney assembly can be concentrically disposed over the first section of the chimney assembly.

In some embodiments, the equipment cabinets can include a divider panel configured to be detachably secured to the frame structure to separate an enclosure formed by the frame structure. In some embodiments, the divider panel can include a vertical joint along which the divider panel can be split. In some embodiments, the divider panel can include a horizontal joint along which the divider panel can be split. In some embodiments, the equipment cabinets can include an airflow baffle disposed at or near the bottom frame assembly configured to guide airflow into the passage formed by the first and second sections of the chimney assembly.

In some embodiments, the equipment cabinets can include horizontal rails mounted to the top frame assembly and the bottom frame assembly. The equipment cabinets can include a vertical rail assembly mechanically connected to the horizontal rails. The vertical rail assembly can be slidable along the horizontal rails in an unloaded configuration. Upon being loaded, the vertical rail assembly can be automatically and mechanically prevented from sliding along the horizontal rails.

In some embodiments, the equipment cabinets can include an interlocking frame section formed in or mounted to the top frame assembly. The equipment cabinets can include a top panel configured and dimensioned to detachably interlock to the interlocking frame sections. In a first configuration, the top panel can be positioned in a first orientation and detachably interlocked with the interlocking frame sections to cover a first half of an opening formed by the top frame assembly. In a second configuration, the top panel can be rotated from the first orientation into a second orientation and detachably interlocked with the interlocking frame sections to cover a second half of the opening formed by the top frame assembly.

In accordance with embodiments of the present disclosure, exemplary methods of equipment cabinet assembly are provided. The methods include providing an equipment cabinet as described herein. The methods include mounting the first section of the chimney assembly to the top frame assembly of the frame structure. The methods further include slidably moving the second section relative to the first section to extend the passage formed by the first and second sections of the chimney assembly.

The methods include concentrically positioning the second section relative to the first section of the chimney assembly. The methods can include maintaining a position of the second section relative to the first section with a fastener of the second section. The fastener can be configured to mate with a nut in a passage of a vertical channel of the first section.

In accordance with embodiments of the present disclosure, exemplary equipment cabinets are provided that include a frame structure. The frame structure includes a top frame assembly and a bottom frame assembly. The equipment cabinets can include horizontal rails mounted to the top frame assembly and the bottom frame assembly. The equipment cabinets further include a vertical rail assembly mechanically connected to the horizontal rails. The vertical rail assembly can be slidable along the horizontal rails in an unloaded configuration. Upon being loaded with a predetermined weight (e.g., with equipment), the vertical rail assembly can be automatically and mechanically prevented from sliding along the horizontal rails.

In the unloaded configuration, a bottom surface of the vertical rail assembly can be vertically spaced from the bottom frame assembly by a gap. In some embodiments, the bottom surface of the vertical rail assembly can be vertically spaced from the bottom frame assembly by a distance of at least approximately 0.31 inches. Upon being loaded with the predetermined weight, the vertical rail assembly can drop downward to position the bottom surface of the vertical rail assembly against the bottom frame assembly to automatically and mechanically prevent sliding of the vertical rail assembly along the horizontal rails (e.g., due to friction). The bottom frame assembly can thereby provide support for the vertical rail assembly in a loaded configuration.

In accordance with embodiments of the present disclosure, exemplary methods of equipment cabinet assembly are provided that include providing the equipment cabinet as described herein. The methods include sliding the vertical rail assembly along the horizontal rails in an unloaded configuration to customize the position of the vertical rail assembly. The methods include loading the vertical rail assembly with a predetermined weight to automatically prevent the vertical rail assembly from sliding along the horizontal rails.

The methods can include maintaining a bottom surface of the vertical rail assembly vertically spaced from the bottom frame assembly in the unloaded configuration. The methods can include downwardly dropping or moving the vertical rail assembly to position the bottom surface of the vertical rail assembly against the bottom frame assembly to automatically prevent sliding of the vertical rail assembly along the horizontal rails upon loading the vertical rail assembly with the predetermined weight.

In accordance with embodiments of the present disclosure, exemplary equipment cabinets are provided that include a frame structure. The frame structure includes a top frame assembly and a bottom frame assembly. The equipment cabinets can include interlocking frame sections formed in or mounted to the top frame assembly. The equipment cabinets can include a top panel configured and dimensioned to detachably interlock to the interlocking frame sections. In a first configuration, the top panel can be positioned in a first orientation and detachably interlocked with the interlocking frame sections to cover a first half of an opening formed by the top frame assembly. In a second configuration, the top panel can be rotated from the first orientation into a second orientation (e.g., approximately 180 degrees) and detachably interlocked with the interlocking frame sections to cover a second half of the opening formed by the top frame assembly.

Each of the interlocking frame sections can include a first central guide and a second central guide including inlet ends and inner endpoints. The inner endpoints of the first and second central guides can be oriented to face each other and a central portion of the interlocking frame sections. Each of the interlocking frame sections can include a first endpoint guide and a second endpoint guide including inlet ends and inner endpoints. The inner endpoints of the first and second endpoint guides can be oriented to face away from each other and from a central portion of the interlocking frame members.

The top panel can include an outer edge, an inner edge, a first side edge, and a second side edge. The top panel includes a non-depressible pin extending from each of the first and second side edges spaced from and adjacent to the inner edge. The top panel includes a depressible pin extending from each of the first and second side edges spaced from and adjacent to the outer edge. In some embodiments, the top panel includes a grommet including elongated members separated by perforations. Each of the elongated members can be adapted for being individually separated from the grommet along the perforations to create customized openings for cable passage.

In accordance with embodiments of the present disclosure, exemplary methods of equipment cabinet assembly are provided that include providing an equipment cabinet as described herein. In a first configuration, the methods include positioning the top panel in a first orientation and detachably interlocking the top panel with the interlocking frame sections to cover a first half of an opening formed by the top frame assembly. In a second configuration, the methods include rotating the top panel from the first orientation into a second orientation and detachably interlocking the top panel with the interlocking frame sections to cover a second half of the opening formed by the top frame assembly.

The methods can include interlocking the non-depressible pins with the first central guides of the interlocking frame sections. The methods can include depressing the depressible pins and interlocking the depressible pins with the first endpoint guides of the interlocking frame sections. The methods can include individually separating elongated members of a grommet of the top panel to create customized openings in the top panel.

In accordance with embodiments of the present disclosure, exemplary equipment cabinets are provided that include a frame structure. The frame structure includes a top frame assembly and a bottom frame assembly. The equipment cabinets include a sensor disposed within an enclosure formed by the frame structure. The equipment cabinets include a condition monitoring assembly. The condition monitoring assembly can be communicatively connected or linked to the sensor. The sensor can detect a condition within the enclosure and transmits a signal representative of the detected condition to the condition monitoring assembly. The condition monitoring assembly can provide a visual indication representative of the detected condition.

The sensor can be at least one of a temperature sensor, a pressure sensor, a humidity sensor, or the like. The condition within the enclosure can be at least one of a temperature level, a pressure level, a humidity level, or the like. It should be understood that the sensor can measure alternative or additional conditions within the cabinet.

The condition monitoring assembly can include a housing and a printed circuit board disposed within the housing. The printed circuit board can include a light emitting member configured to be actuated for providing the visual indication of the detected condition. The light emitting member can be configured to emit different colors based on a status of the detected condition. The light emitting member can be configured to emit different patterns of light based on a status of the detected condition. In some embodiments, the light emitting member can act as a backlight for the condition monitoring assembly. In some embodiments, the condition monitoring assembly can include an opening in a front cover through which light from the light emitting member is visualized.

In accordance with embodiments of the present disclosure, exemplary methods of monitoring a condition of an equipment cabinet are provided that include providing the equipment cabinet as described herein. The methods include detecting a condition within the enclosure with the sensor. The methods include transmitting a signal representative of the detected condition to the condition monitoring assembly The methods include providing a visual indication representative of the detected condition with the condition monitoring assembly.

In some embodiments, the methods can include emitting one or more lights with a light emitting member within the condition monitoring assembly as the visual indication of the detected condition. In some embodiments, the methods can include emitting one or more light patterns with a light emitting member within the condition monitoring assembly as the visual indication of the detected condition.

In accordance with embodiments of the present disclosure, exemplary equipment cabinets are provide that include a frame structure. The frame structure includes a top frame assembly and a bottom frame assembly. The bottom frame assembly includes a first inner corner and a second inner corner. The equipment cabinets include a plate disposed in the first inner corner of the bottom frame assembly. The plate can be complementary in shape to the shape of the first inner corner of the bottom frame assembly. The plate can be secured, e.g., welded, or the like, to the bottom frame assembly at the first inner corner to reinforce the frame structure.

The bottom frame assembly and the plate can include complementary weld openings formed therein. The weld opening of the plate can be dimensioned greater than the weld opening of the bottom frame assembly to allow for a stronger weld between the two components. The equipment cabinet can include a cross member extending along an inner surface of the bottom frame assembly. The cross member can include a flange extending from an elongated body. The flange can be complementary in shape to the shape of the second inner corner of the bottom frame assembly. The flange of the cross member can be secured, e.g., welded, or the like, to the bottom frame assembly at the second inner corner to reinforce the frame structure.

In accordance with embodiments of the present disclosure, exemplary methods of equipment cabinet assembly are provided that include providing the equipment cabinet as described herein. The methods include disposing the plate in the first inner corner of the bottom frame assembly. The methods include securing, e.g., welding, the plate to the bottom frame assembly at the first inner corner to reinforce the frame structure. In some embodiments, the methods include a flange of a cross member to the bottom frame assembly at the second inner corner to reinforce the frame structure.

In accordance with embodiments of the present disclosure, exemplary equipment cabinets are provided that include a frame structure. The frame structure includes a top frame assembly and a bottom frame assembly. The frame structure can define an enclosure. The equipment cabinets include a divider panel configured to be detachably secured to the frame structure to separate the enclosure. The divider panel can include at least one of a vertical joint or a horizontal joint along which the divider panel can be split.

The divider panel can include one or more interlocking mechanisms along at least one of the vertical joint or the horizontal joint for splitting and joining the divider panel along the vertical joint or the horizontal joint. In some embodiments, the divider panel can include knockouts configured to be removed from the divider panel. In some embodiments, the divider panel can include perforations along all or a portion of the divider panel adapted for passage of airflow therethrough.

In some embodiments, the equipment cabinets can include a side panel configured and dimensioned to be detachably secured to a side of the frame structure to enclose the enclosure. The side panel can include a vertical joint, a horizontal joint, or both, along which the side panel can be split. In some embodiments, the equipment cabinets can include insulating material attached to an inner surface of the side panel. In some embodiments, the equipment cabinets can include a door assembly including a door structure and insulating material attached to an inner surface of the door structure.

In accordance with embodiments of the present disclosure, exemplary methods of equipment cabinet assembly are provided that include providing the equipment cabinet as described herein. The methods include detachably securing the divider panel to the frame structure to separate the enclosure. The methods can include splitting the divider panel along the vertical joint and/or the horizontal joint to create a shared portion of the enclosure while maintaining a separated portion of the enclosure with a remaining divider panel half.

Any combination or permutation of embodiments is envisioned. Additional advantageous features, functions and applications of the disclosed methods and assemblies of the present disclosure will be apparent from the description which follows, particularly when read in conjunction with the appended drawings. It is to be understood, however, that the drawings are designed as an illustration only and not as a definition of the limits of the invention. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various steps, features and combinations of steps/features described below and illustrated in the figures can be arranged and organized differently to result in embodiments which are still within the scope of the present disclosure. To assist those of ordinary skill in the art in making and using the disclosed equipment cabinets and associated methods, reference is made to the appended figures, wherein.

DESCRIPTION OF EXEMPLARY EMBODIMENTS

The exemplary embodiments disclosed herein are illustrative of advantageous equipment cabinets that provide for advanced variability for cable management and heat dissipation within the equipment cabinets. In particular, the equipment cabinets allow for variability in the structure of the cabinets based on the cable management needs. In addition, the equipment cabinets include features for ventilation or cooling of equipment disposed in the cabinets. The equipment cabinets are also structured to meet the typical regulations for cabinets or information technology (IT) cabinets, and provide reinforcement in critical areas. Although discussed herein with respect to cabinets, it should be understood that at least some of the features and/or structures discussed herein can also be utilized with respect to equipment racks.

Figure 1:
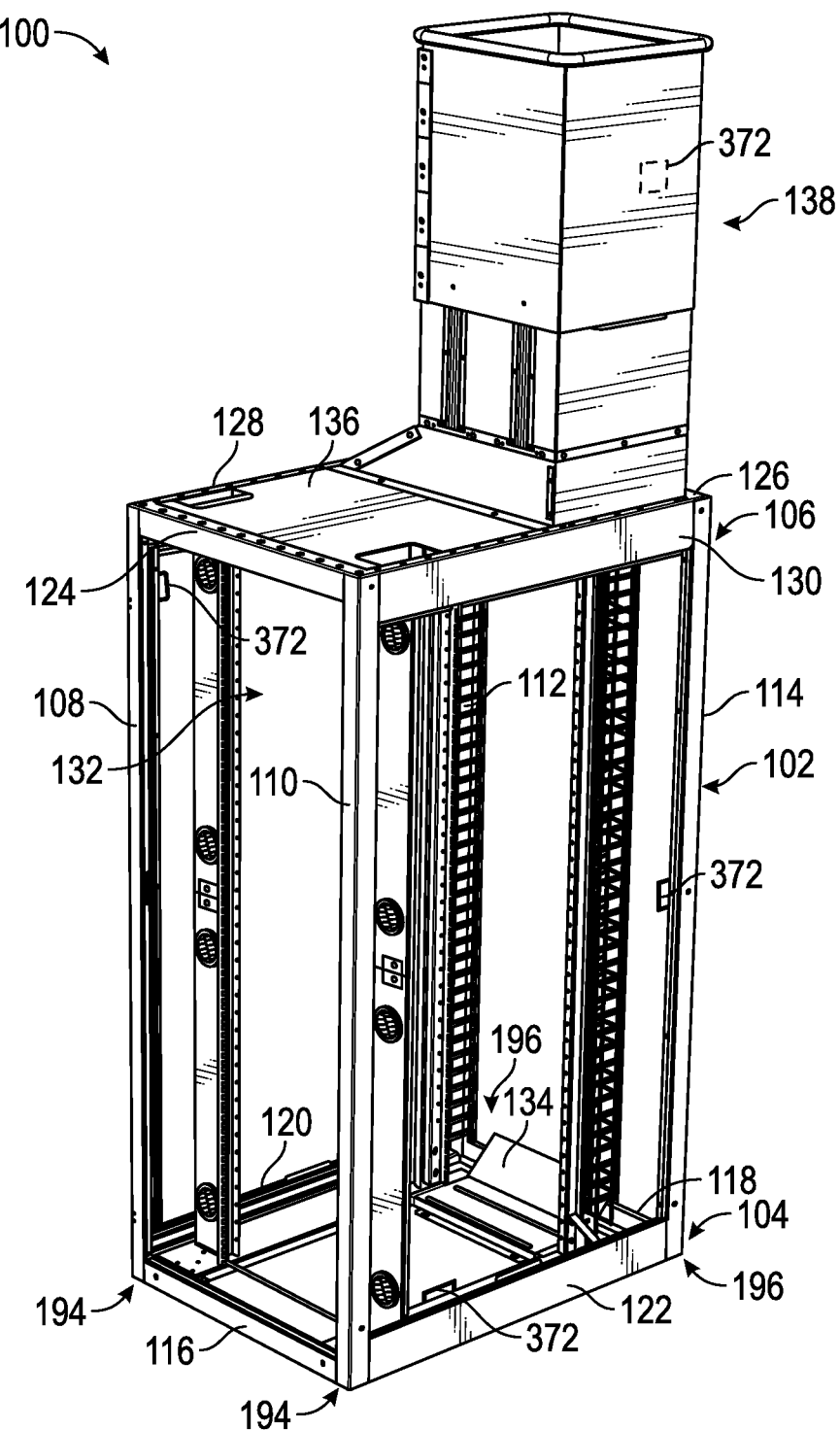
FIG. 1 is a perspective view of an exemplary equipment cabinet according to the present disclosure.

With reference to FIG. 1, a perspective view of an exemplary equipment cabinet 100 (hereinafter "cabinet 100") is provided. The cabinet 100 includes a frame structure 102 that includes a bottom frame assembly 104 and a top frame assembly 106. The bottom and top frame assemblies 104, 106 can be structurally connected to each other with vertical frame members, e.g., front vertical frame members 108, 110 and rear vertical frame members 112, 114. It should be understood that the bottom frame assembly 104 can be positioned against a supporting surface, e.g., a floor, padding, or the like, in an equipment room.

The bottom frame assembly 104 includes a front bottom frame member 116, a rear bottom frame member 118, a first side bottom frame member 120, and a second side bottom frame member 122. The front, rear, first side, and second side bottom frame members 116-122 can be secured to the front and rear vertical frame members 108-114 such that the frame members 108-122 uniformly contact the supporting surface in the equipment room. The top frame assembly 106 includes a front top frame member 124, a rear top frame member 126, a first side top frame member 128, and a second side top frame member 130. The front, rear, first side, and second side top frame members 124-130 can be secured to the front and rear vertical frame members 108-114 such that the frame members 108-114, 124-130 define a uniform top surface perimeter of the cabinet 100. The bottom frame assembly 104 can include front corner assemblies 194 at the interconnection of the front bottom frame member 116 and the first and second side bottom frame members 120, 122. The bottom frame assembly 104 can include rear corner assemblies 196 at the interconnection of the rear bottom frame member 118 and the first and second side bottom frame members 120, 122.

The enclosure 132 defined by the bottom and top frame assemblies 104, 106 and the front and rear vertical frame members 108-114 can be configured and dimensioned to receive equipment, e.g., telecommunications equipment, or the like, therein. In some embodiments, the frame structure 102 of the cabinet 100 can be fabricated from formed and welded steel of various gauges. In some embodiments, the frame structure 102 can be fully welded with the vertical frame members 108-114 (e.g., uprights) of 12 gauge steel.

In some embodiments, the cabinet 100 can include an airflow baffle 134 mounted to or near the bottom frame assembly 104. The airflow baffle 134 can assist in guiding airflow passing through the cabinet 100 for cooling the equipment stored therein. In some embodiments, the cabinet 100 can include one or more top panels 136. In some embodiments, the cabinet 100 can include a chimney assembly 138. The exemplary features associated with the cabinet 100 will be described in greater detail below. It should be understood that all of the exemplary features can be included in the cabinet 100, the cabinet 100 can include only one of the exemplary features, or the cabinet 100 can include various combinations of the exemplary features.

Figure 2:
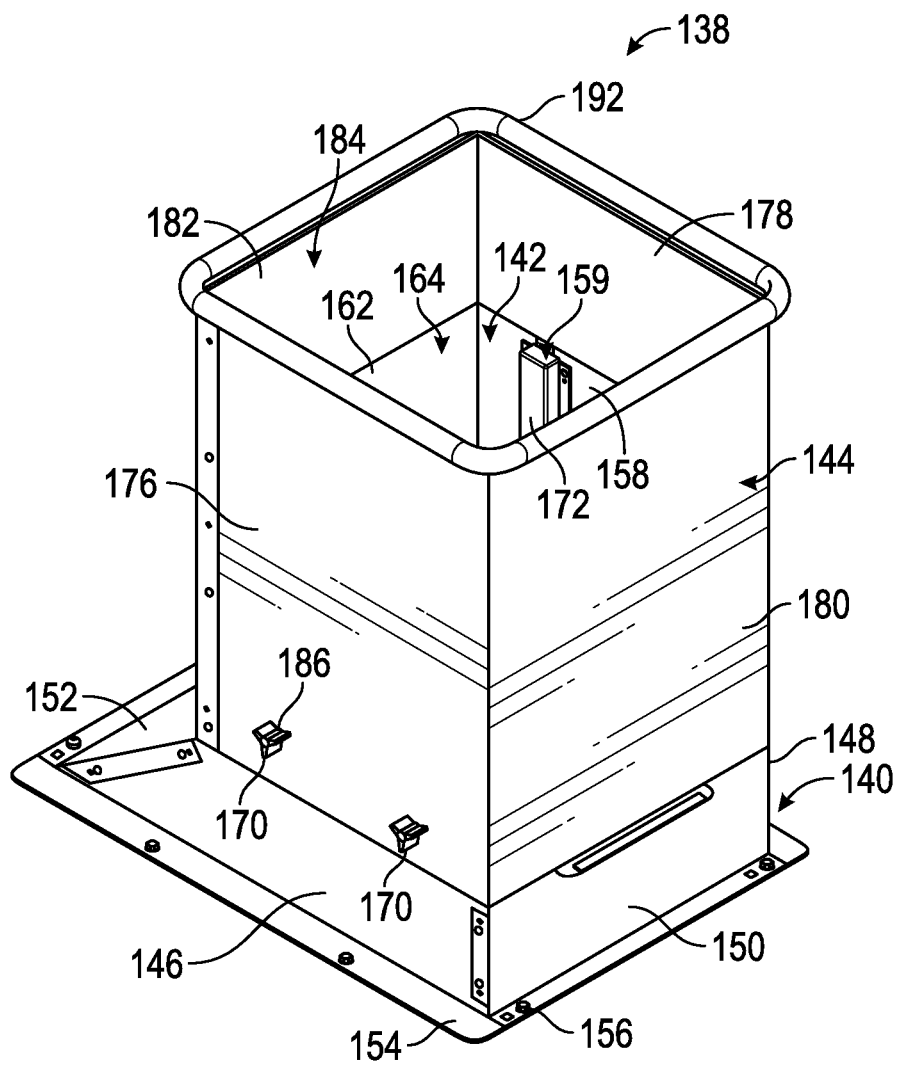
FIG. 2 is a perspective view of a chimney assembly of an exemplary equipment cabinet in a retracted position according to the present disclosure.
Figure 3:
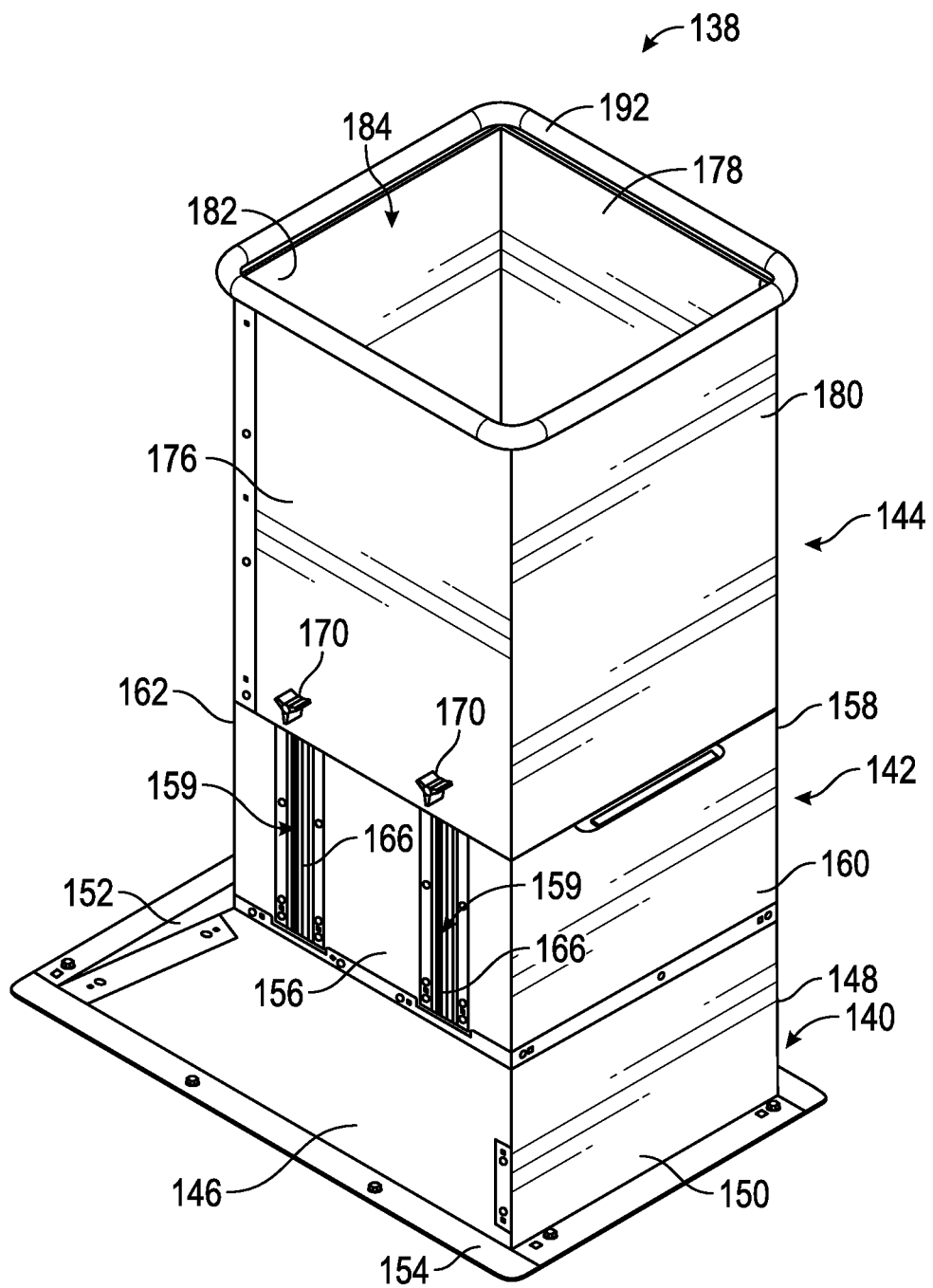
FIG. 3 is a perspective view of a chimney assembly of an exemplary equipment cabinet in an extended position according to the present disclosure.
Figure 4:
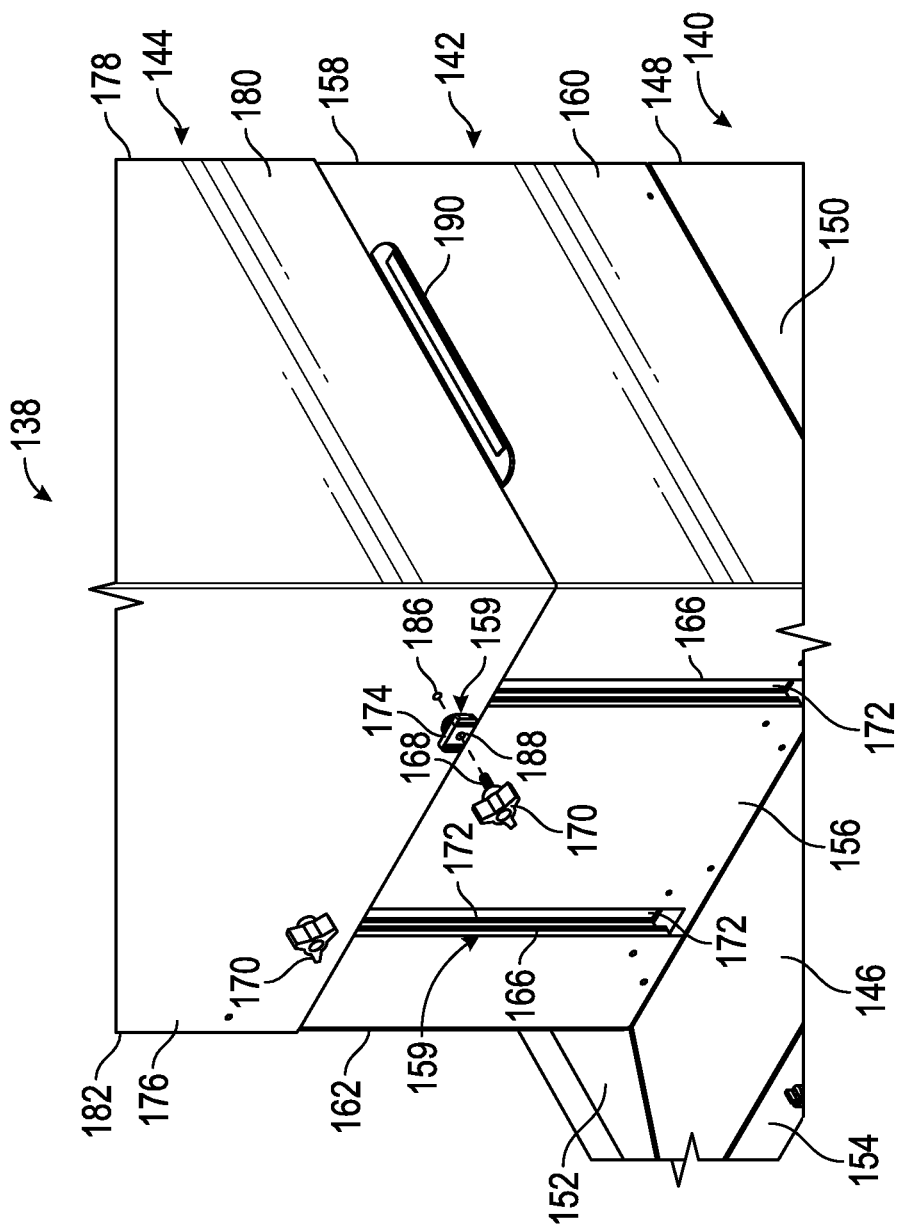
FIG. 4 is a detailed, perspective view of a chimney assembly of an exemplary equipment cabinet in an extended position according to the present disclosure.

Turning now to FIGS. 2-4, perspective views of an exemplary chimney assembly 138 of the cabinet 100 are provided. In particular, FIG. 2 shows the chimney assembly 138 in a retracted position, FIG. 3 shows the chimney assembly 138 in an extended position, and FIG. 4 shows a partially exploded view of the chimney assembly 138. Traditional chimneys for equipment cabinets generally include multiple components and require extended installation times with multiple tools and two or more installers. In contrast, the exemplary chimney assembly 138 provides a ventilation system for the cabinet 100 that can be installed with minimal effort and can be vertically adjusted without external tools.

The chimney assembly 138 includes a base section 140, a first middle section 142, and a second middle section 144 (e.g., an extension section). In some embodiments, the base section 140, the first middle section 142, and the second middle section 144 can be fabricated from steel. The base section 140 includes a front wall 146, a rear wall 148, a first side wall 150, and a second side wall 152. In some embodiments, two or more of the walls 146-152 can be angled relative to the first and second middle sections 142, 144. In some embodiments, each of the walls 146-152 can be substantially parallel relative to the first and second middle sections 142, 144. In some embodiments, as shown in FIGS. 2-4, the front, rear and first side walls 146-150 can be substantially parallel to the first and second middle sections 142, 144, and the second side wall 152 can be angled relative to the first and second middle sections 142, 144. The walls 146-152 of the base section 140 can define a passage therebetween for air ventilation from the cabinet 100. In particular, the bottom of the base section 140 can be open to the enclosure 132 of the cabinet 100 such that airflow passing through the cabinet 100 can be ventilated out through the chimney assembly 138.

The base section 140 further includes a flange 154 extending from bottom perimeter of the walls 146-152. The flange 154 includes a plurality of apertures 156 formed therein for mounting and securing the base section 140 of the chimney assembly 138 to cabinet 100 with fastening members, e.g., screws, or the like. (See, e.g., FIG. 1). In particular, the flange 154 can be secured to, e.g., the front frame member 124, the rear frame member 126, the first side frame member 128, the second side frame member 130, combinations thereof, or the like.

The base section 140 can be fixedly secured to the first middle section 142. The first middle section 142 includes a front wall 156, a rear wall 158, a first side wall 160, and a second side wall 162. The walls 156-162 can be secured relative to each other and can extend in a substantially parallel direction to define a square or rectangular passage 164 that allows removal of heat and ventilated air from the cabinet 100. The front wall 156 (and, in some embodiments, the rear wall 158, the first side wall 160, and/or the second side wall 162) can include one or more fastening assemblies 159. Each fastening assembly 159 can include a vertical slot or channel 166 formed in the front wall 156 and extending along a portion of the height of the front wall 156. The channels 166 can be configured and dimensioned to receive a threaded extension 168 of a fastener 170, e.g., a threaded knob, therethrough. In some embodiments, the fastener 170 can be an over-molded threaded bolt.

On the inner surface of the front wall 156 and within the passage 164, the fastening assembly 159 can include a vertical guide 172 corresponding to the respective vertical channel 166. The vertical guide 172 can define a housing configured and dimensioned to slidably receive therein a nut 174, e.g., a spring-loaded nut. In particular, the vertical guide 172 can define a passage in which the nut 174 can slide along a vertical direction.

The second middle section 144 (e.g., an extension section) includes a front wall 176, a rear wall 178, a first side wall 180, and a second side wall 182. The walls 176-182 can be secured relative to each other and can extend in a substantially parallel direction to define a square or rectangular passage 184 that allows removal of heat and ventilated air from the cabinet 100. The second middle section 144 can be dimensioned slightly bigger than the first middle section 142 such that the second middle section 144 can be slid over the first middle section 142. In particular, the second middle section 144 can fit over the first middle section 142 and can be slidably positioned relative to the first middle section 142 in a vertical direction between a retracted position (see, e.g., FIG. 2) and an extended position (see, e.g., FIG. 3). The movable and variable extension of the second middle portion 144 allows the chimney assembly 138 to be adjusted and customized for different ventilation systems, e.g., ventilation systems or ceilings of different heights. In some embodiments, a substantially air-tight connection can be formed between the overlapping portions of the first and second middle sections 142, 144 to ensure that all or the majority of the ventilated air is passed through the passages 164, 184 and does not escape into the equipment room.

The front wall 176 includes one or more openings 186 formed therein configured and dimensioned to receive therethrough the extension 168 of the fastener 170. The opening 186 can be formed in the front wall 176 in a position offset from the bottom surface of the second middle section 144. During assembly, the nuts 174 can be positioned within the vertical guides 172, the second middle section 144 can be slid over the first middle section 142, and the threaded extension 168 of the fasteners 170 can be passed through the openings 186 and into the threaded openings 188 of the nuts 174. The fastener 170 can be rotated to mate with the nut 174 to fixate the second middle section 144 to the first middle section 142. To adjust the position of the second middle section 144 relative to the first middle section 142, the fastener 170 can be partially loosened from the nut 174, the second middle section 144 can be slid upwards to the desired extension (while simultaneously sliding the nut 174 within the vertical guide 172), and the fastener 170 can be tightened to the nut 174 to fixate the second middle section 144 to the first middle section 142. In some embodiments, the nut 174 can be spring-loaded such that pulling outwardly on the fastener 170 disengages the nut 174 within the vertical guide 172 to allow movement of the second middle section 144, and releasing the fastener 170 engages the nut 174 within the vertical guide 172 to prevent movement of the second middle section 144. The extension of the chimney assembly 138 can thereby be adjusted in a fast and convenient manner without additional tools. As an example, FIG. 2 shows the chimney assembly 138 with the second middle section 144 in a retracted or non-extended position, and FIG. 3 shows the chimney assembly 138 with the second middle section 144 in an extended position.

In some embodiments, one or more of the walls 176-182 of the second middle section 144 can include a flange 190, e.g., a handle, extending at an angle or perpendicularly from a bottom edge. The flange 190 can be used to assist in sliding the second middle section 144 along a vertical direction relative to the first middle section 142 by providing a grip for the user against which pressure can be applied. In some embodiments, the walls 176-182 of the second middle section 144 can include a seal 192, e.g., a rubber seal, a foam seal, or the like, attached thereto along the top perimeter edge. The seal 192 can assist in creating a substantially air-tight seal between the chimney assembly 138 and external equipment, e.g., a duct, against which the second middle section 144 is positioned to vent the air from the cabinet 100. In some embodiments, the airflow baffle 134 positioned on or near the rear bottom frame member 118 can guide the airflow passing through the cabinet 100 in the direction of the chimney assembly 138. The airflow baffle 134 can facilitate airflow and prevent air turbulence at the bottom of the cabinet 100.

Figure 5:
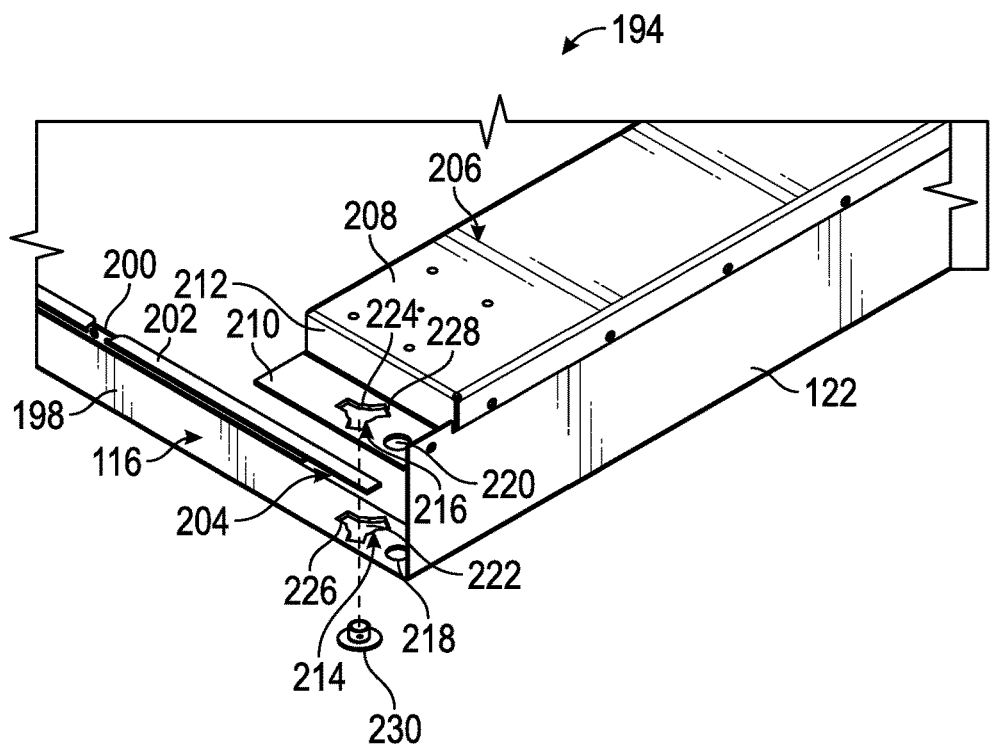
FIG. 5 is an exploded, perspective view of a front corner assembly of an exemplary equipment cabinet according to the present disclosure.
Figure 6:
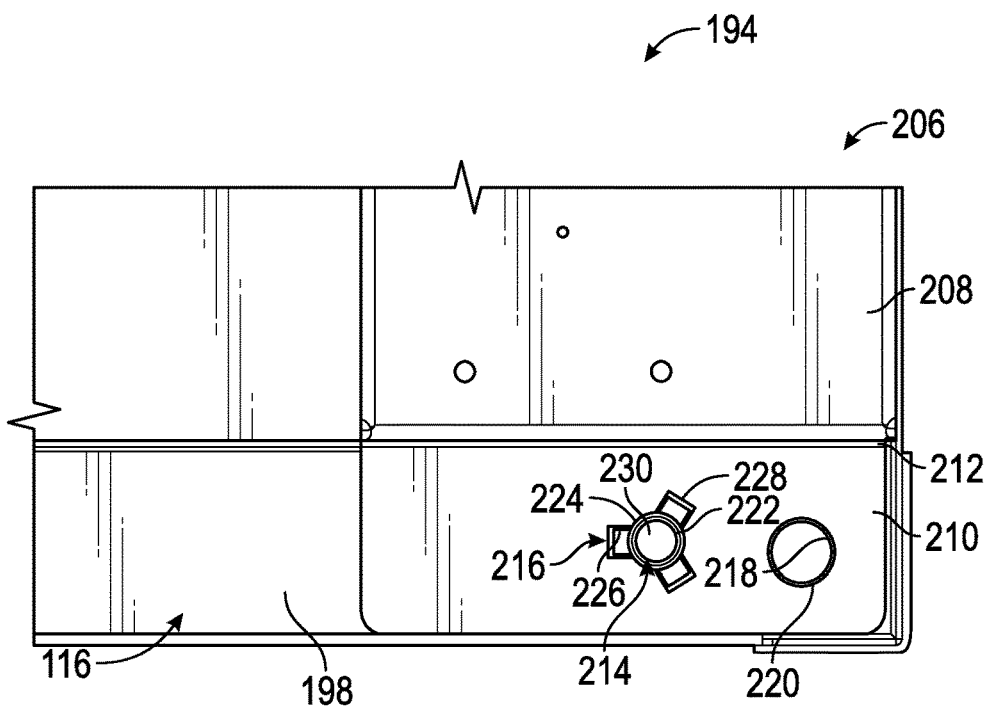
FIG. 6 is a top view of a front corner assembly of an exemplary equipment cabinet according to the present disclosure.
Figure 7:
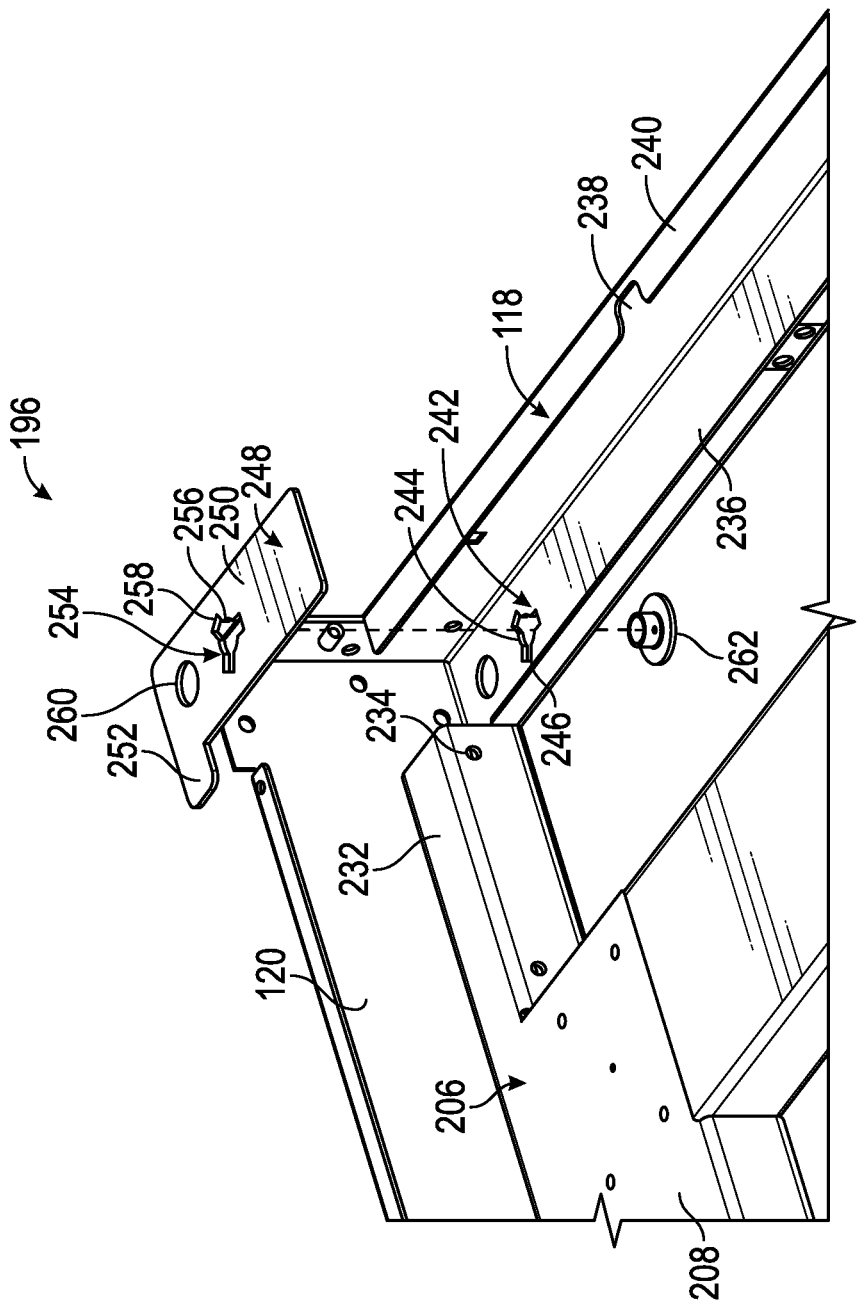
FIG. 7 is an exploded, perspective view of a rear corner assembly of an exemplary equipment cabinet according to the present disclosure.

Turning now to FIGS. 5-7, exemplary front and rear corner assemblies 194, 196 of the cabinet 100 are provided. In particular, FIGS. 5 and 6 show perspective and top views of the front corner assembly 194 of the bottom frame assembly 104, and FIG. 7 shows a perspective view of the rear corner assembly 196 of the bottom frame assembly 104. With respect to FIGS. 5 and 6, the front bottom frame member 116 includes a bottom horizontal portion 198 and a vertical flange 200 extending from an inner edge of the bottom horizontal portion 198. The vertical flange 200 can extend perpendicularly from the bottom horizontal portion 198. The front bottom frame member 116 further includes a horizontal flange 202 extending perpendicularly from the vertical flange 200.

The vertical flange 200 can extend a partial distance along the width of the front bottom frame member 116. The horizontal flange 202 can also extend a partial distance along the width of the front bottom frame member 116. In particular, the horizontal flange 202 can extend a distance along the width of the front bottom frame member 116 dimensioned between the width of the front bottom frame member 116 and the vertical flange 200. Specifically, the width of the horizontal flange 202 can be greater than the vertical flange 200 and shorter than the front bottom frame member 202. The horizontal flange 202 can extend in a direction parallel to the bottom horizontal portion 198. The differently dimensioned horizontal flange 202 relative to the bottom horizontal portion 198 and the vertical flange 200 can form an elongated opening or slot 204. The slot 204 can be configured and dimensioned to receive partially therethrough a portion of a cross member 206.

The cross member 206 includes an elongated body 208, e.g., a middle portion, with a front flange or plate 210 extending from a front bottom edge of the elongated body 208. In particular, the elongated body 208 can form a step 212 upwards from the plate 210. The plate 210 can define a substantially rectangular and planar extension that can be configured and dimensioned to be at least partially passed through the slot 204 of the front bottom frame member 116. The plate 210 and the bottom horizontal portion 198 can include complementary weld openings 214, 216 formed therein. In some embodiments, the plate 210 and the bottom horizontal portion 198 can include complementary circular openings 218, 220 formed therein between the weld openings 214, 216 and the junction of the front bottom frame member 116 and the second side bottom member 122.

In some embodiments, the weld openings 214, 216 can include a circular central portion 222, 224 and two or more radially extending slots 226, 228. In some embodiments, the weld openings 214, 216 can be dimensioned substantially similarly. In some embodiments, as shown in FIGS. 5 and 6, the weld opening 214 of the bottom horizontal portion 198 can be dimensioned smaller than the weld opening 216 of the plate 210. The larger weld opening 216 of the plate 210 can thereby expose at least a portion of the surface of the bottom horizontal portion 198 surrounding the weld opening 214 to allow for improved welding therebetween.

During assembly, the plate 210 can be positioned onto the bottom horizontal portion 198 such that the weld openings 214, 216 are aligned relative to each other. A weld nut 230 can penetrate both the bottom horizontal portion 198 and the plate 210 through the weld openings 214, 216 (e.g., a double hull structure). As the weld nut 230 is melted, the bead formed from the weld nut 230 can pass through the larger weld opening 216, thereby extending the bead to the bottom horizontal portion 198 and the plate 210. The formation of the bead through the larger weld opening 216 allows chemical bonding between the surfaces of both the bottom horizontal portion 198 and the plate 210, creating a stronger and reinforced weld. The plate 210 further acts as a secondary reinforcement plate that reinforces the front corner assembly 194, providing additional strength for increased weight load capacity without introducing a cross member between the midpoints of the front and rear bottom frame members 116, 118. The absence of a middle cross member allows for an unobstructed vertical pathway for cable management and crates an unobstructed airflow passage for airflow and heat management within the cabinet 100. The reinforcement of the cross member 206 can further assist in preventing deflection during, e.g., ASCE-7 testing, UL testing, or the like.

With reference to FIG. 7, the cross member 206 can include an extension 232 on an opposing end of the elongated body 208 from the plate 210. The extension 232 can define a rectangular or square-shaped hollow tube formed from bent material, such as steel. The extension 232 can include openings 234 formed therein for fixedly securing the cross member 206 to the respective first and second side bottom frame members 120, 122 with fastening members, e.g., screws, or the like. The plate 210 can provide reinforcement to the front corner assemblies 194. The cross members 206 can further provide reinforcement to the first and second side bottom frame members 120, 122. The additional reinforcement increases the strength of the frame structure 102, allowing for increased weight load capacity without introducing an additional cross member extending between midpoints of the front and rear bottom frame members 116, 118. The absence of a middle cross member allows for an unobstructed vertical pathway for cable management and airflow passage.

Still with reference to FIG. 7, a perspective view of the rear corner assembly 196 is provided. The rear bottom frame member 118 includes a bottom horizontal portion 236, a vertical flange 238 extending perpendicularly from a front edge of the bottom horizontal portion 236, and a horizontal flange 240 extending perpendicularly from the vertical flange 238 in the direction of the enclosure 132. The bottom horizontal portion 236 can extend the width of the rear bottom frame member 118, while the horizontal flange 240 extends a partial width of the rear bottom frame member 118. The bottom horizontal portion 236 includes a weld opening 242 formed therethrough spaced from each of the edges adjacent to the respective first and second side bottom frame members 120, 122. The weld opening 242 includes a substantially circular central opening 244 and two or more radially spaced slots 246. The weld opening 242 can be configured and dimensioned substantially similarly to the weld opening 214 of the front bottom frame member 116.

The rear corner assembly 196 further includes a plate 248, e.g., an L-shaped plate. The plate 248 can be substantially planar in configuration and includes an elongated body 250 with an extension 252. The elongated body 250 can be configured and dimensioned to be positioned on the bottom horizontal portion 236 and adjacent to the inner surface of the rear bottom frame member 118 and the respective first and second side bottom frame members 120, 122. The elongated body 250 of the plate 248 includes a weld opening 254 formed therein. The weld opening 254 can be substantially similar in configuration and dimension to the weld opening 216 of the cross member 206. In particular, the weld opening 254 can include a substantially circular central opening 256 and two or more radially spaced slots 258. The weld opening 254 can be dimensioned slightly greater than the weld opening 242 of the rear bottom frame member 118 such that a surface of the bottom horizontal portion 236 is exposed through the weld opening 254. In some embodiments, the plate 248 can include an opening 260 formed therein and spaced from the weld opening 254.

During assembly, the plate 248 can be positioned on the bottom horizontal portion 236 such that the weld openings 242, 254 are aligned relative to each other. The extension 252 can be inserted into the cavity within the extension 232 of the cross member 206 to assist in securing the cross member 206 to the frame structure 102. A weld nut 262 can be passed through the weld openings 242, 254 of both the bottom horizontal portion 236 and the plate 248 (e.g., a double hull structure) and is used to weld the plate 248 to the bottom horizontal portion 236. The larger weld opening 254 exposes a portion of the surface of the bottom horizontal portion 236 therethrough allowing the weld bead to chemically bond the surfaces of the bottom horizontal portion 236 and the plate 248 together. The plate 248 acts as a secondary reinforcement plate that reinforces the rear corner assembly 196, providing additional strength for increased weight load capacity without introducing a cross member between the midpoints of the front and rear bottom frame members 116, 118. The absence of a middle cross member allows for an unobstructed vertical pathway for cable management and creates an unobstructed airflow passage for airflow and heat management within the cabinet 100. The reinforcement of the cross members 206 and/or the plates 248 can further assist in preventing deflection during, e.g., ASCE-7 testing, UL testing, or the like.

Figure 8:
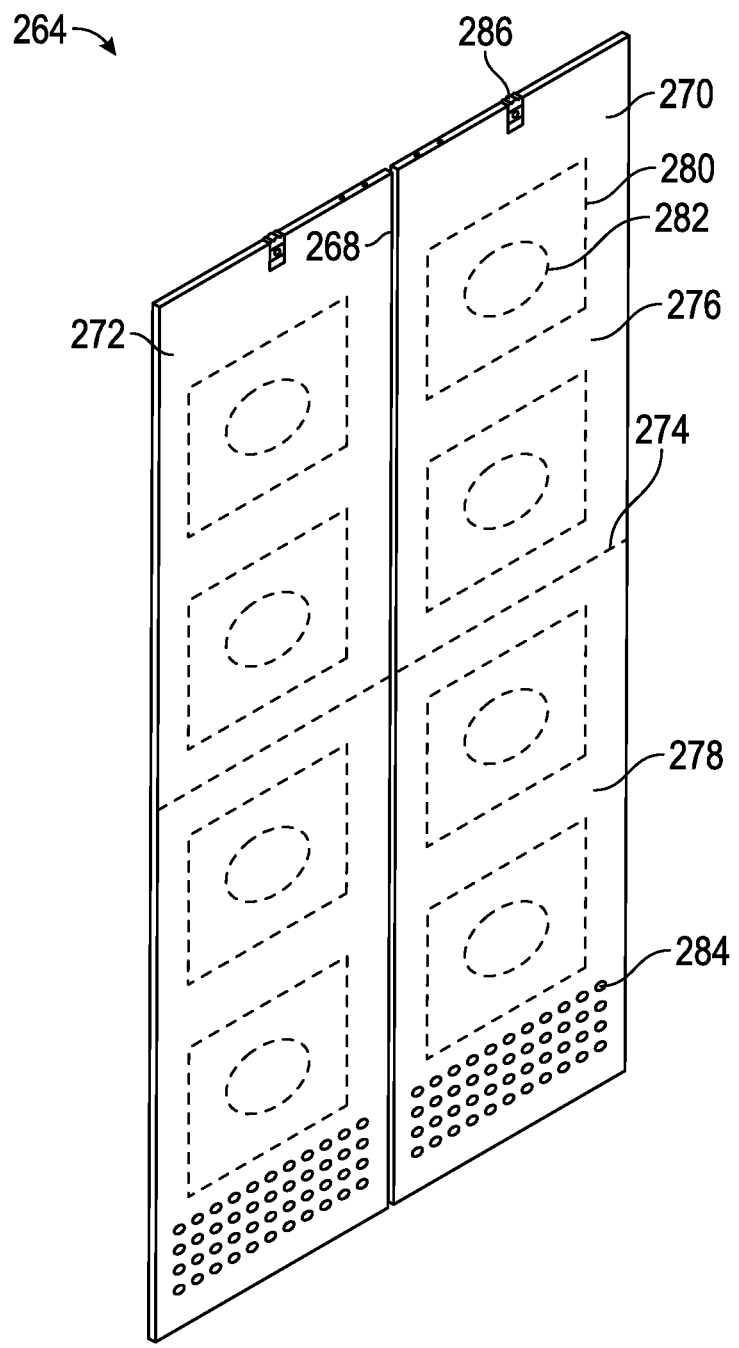
FIG. 8 is a perspective view of a divider panel of an exemplary equipment cabinet according to the present disclosure.
Figure 9:
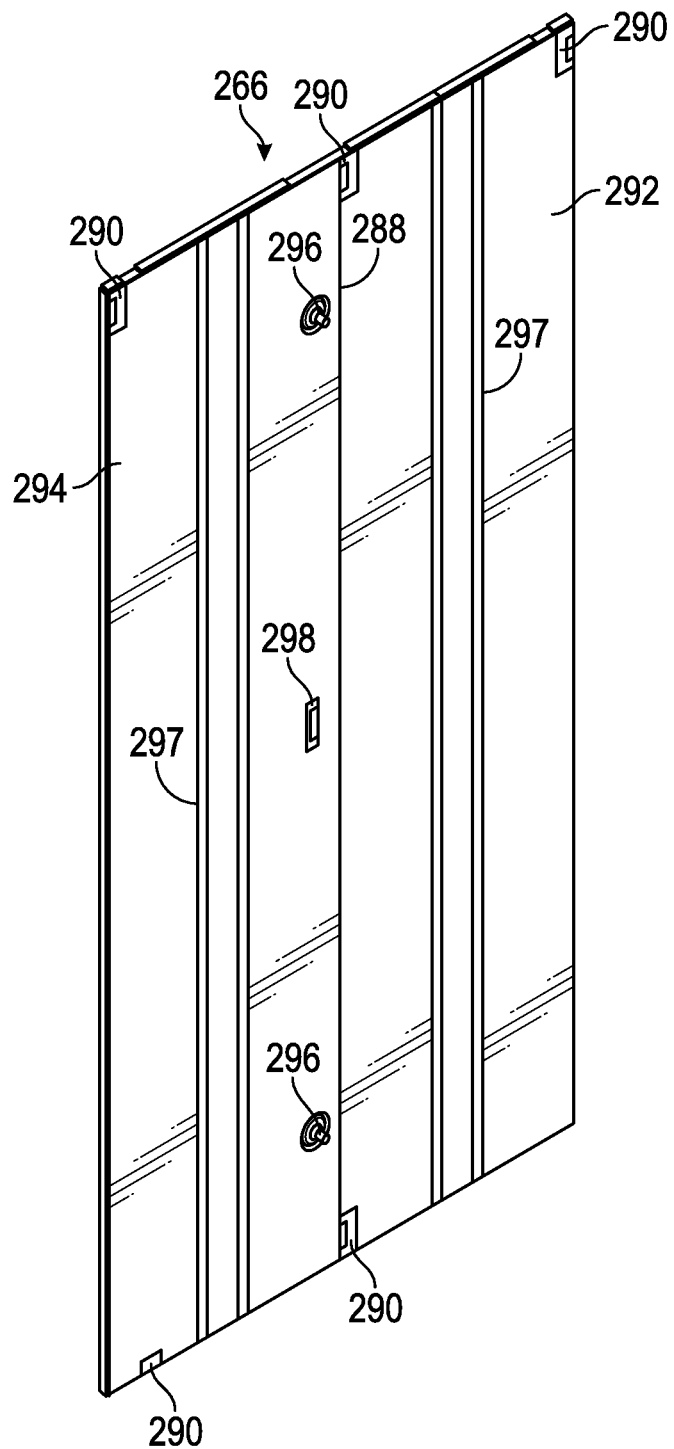
FIG. 9 is a perspective view of a side panel of an exemplary equipment cabinet according to the present disclosure.

Turning now to FIGS. 8 and 9, perspective views of exemplary divider panels 264 and side panels 266 are provided. The divider panels 264 can be detachably secured to the frame structure 102 to extend between the front and rear top and bottom frame members 116, 118, 124, 126 to divide the enclosure 132 into two or more enclosures along the depth of the cabinet 100. The side panels 266 can be detachably secured to the sides and/or rear of the cabinet 100, e.g., the front and rear vertical frame members 108-114, the bottom and top frame members 116-130, combinations thereof, or the like. In particular, the side panels 266 can form the sides and/or rear of the cabinet 100 to create the enclosure 132.

With respect to FIG. 8, the divider panel 264 includes a substantially planar structure. The divider panel 264 can be a solid one piece, vertically split, and/or horizontally split. In particular, in some embodiments, the divider panel 264 can be a solid, one piece construction that cannot be split vertically or horizontally, and is attached to the frame structure 102 to completely separate the enclosure 132.

In some embodiments, the divider panel 264 can include one or more vertical divider joints 268 along which the divider panel 264 can be vertically split. The vertical divider joint 268 can include an interlocking mechanism that can be used to separate and interlock the first and second vertical sides 270, 272 of the divider panel 264 relative to each other. In some embodiments, each of the first and second vertical sides 270, 272 can be dimensioned as half of the depth of the cabinet 100. In some embodiments, the divider panel 264 can include one or more horizontal divider joints 274 along which the divider panel 264 can be horizontally split. The horizontal divider joint 274 can include an interlocking mechanism that can be used to separate and interlock the first and second horizontal sides 276, 278 of the divider panel 264 relative to each other. The divider panel 264 can thereby be used to divide only the desired portion of the enclosure 132, while maintaining a substantially open enclosure 132 in the undivided area of the cabinet 100.

In some embodiments, the divider panel 264 can include one or more knockouts 280, 282, e.g., rectangular knockouts, square knockouts, circular knockouts, combinations thereof, or the like, formed therein. The knockouts 280, 282 can be formed via perforated lines in the divider panel 264 to allow convenient removal of the knockouts 280, 282 based on the needs of the user. Thus, for example, the knockouts 280, 282 can be used to connect the opposing sides of the enclosure 132 separated by the divider panel 264 to allow for passage of cables therebetween and/or for airflow management (e.g., through vent holes).

In some embodiments, the divider panel 264 can include perforations 284 (e.g., openings) along all or a portion of the divider panel 264 to allow passage of airflow through the divider panel 264. The perforations 284 improve airflow management within the enclosure 132 while providing for security by maintaining a division of the enclosure 132 with the divider panel 264. In some embodiments, the divider panel 264 can include both solid and perforated portions on the same divider panel 264 for controlled airflow through the divider panel 264. As discussed above, the divider panel 264 can include one or more interlocking mechanisms 286 for detachably securing the divider panel 264 to the frame structure 102. For example, the divider panel 264 can include interlocking mechanisms 286 on the top and bottom edges of the divider panel 264.

With reference to FIG. 9, the side panel 266 can define a substantially planar structure. In some embodiments, the side panel 266 can include one or more vertical divider joints 288 for splitting the side panel 266 along the height of the side panel 266. In some embodiments, each of the first and second vertical sides 292, 294 can be dimensioned as half of the depth and/or width of the cabinet 100. Although not illustrated, it should be understood that the side panel 266 can include one or more horizontal divider joints, knockouts, vent holes, perforations, or combinations thereof, similar to those of the divider panel 264. For example, the side panel 266 can include openings 296 from which knockouts have been removed to allow passage of cables through the side panel 266. In some embodiments, the side panel 266 can include one or more vertical and/or horizontal reinforcements 297, e.g., welded in stiffeners, that provide rigidity to the side panel 266. The side panel 266 can include one or more interlocking mechanisms 290 along the edges of the side panel 266 to allow interlocking of, e.g., the first and second vertical sides 292, 294 relative to each other, the side panel 266 to the frame structure 102, combinations thereof, or the like. In some embodiments, the side panel 266 can include a handle 298 for unlocking the position of the second vertical side 294 from the first vertical side 292.

The structure of the divider and side panels 264, 266 permits customization of the structure and passages of the divider and side panels 264, 266, thereby improving cable management, airflow management, or both. For example, one or more parts of the side panel 266 or the entire side panel 266 can be removed from a rear of the cabinet 100 to create a common plenum between two or more cabinets 100 positioned adjacent to each other without compromising front-to-rear airflow. The common plenum provides redundancy for the chimney assembly 138 while normalizing the pressure and temperature across the row of cabinets 100. In particular, the chimney assemblies 138 at each cabinet 100 can assist in simultaneously venting the enclosures 132 and the common plenum creates a space in which the airflow from all adjacently positioned cabinets 100 can flow, thereby normalizing the pressure and temperature across the row of cabinets 100. Thus, venting or cooling for cabinets 100 that require additional airflow management as compared to adjacently positioned cabinets 100 can be provided by the equipment and/or chimney assemblies 138 of the adjacently positioned cabinets 100.

For example, the common plenum can create a pathway for the hot exhaust air to exhaust through any chimney assembly 138 of the row of cabinets 100. If one chimney assembly 138 is at a maximum capacity, the exhausted airflow can migrate to a chimney assembly 138 in the row of cabinets 100 that has an unused capacity. The pressure and/or temperature in the cabinets 100 can also be more equally distributed in the common plenum as compared to independent cabinets 100 that have high and low densities. For example, in a row of cabinets 100 having a common plenum, a high density cabinet 100 can "borrow" the capacity from a lower density cabinet 100, thereby normalizing the return airflow and more evenly distributing the negative plenum pressure in the return plenum. Cooling capabilities can therefore be calculated for the entire row of cabinets 100, e.g., a row level, instead of at the single cabinet 100 or cabinet level, and the overall efficiency of the cooling system can be optimized.

Figure 10:
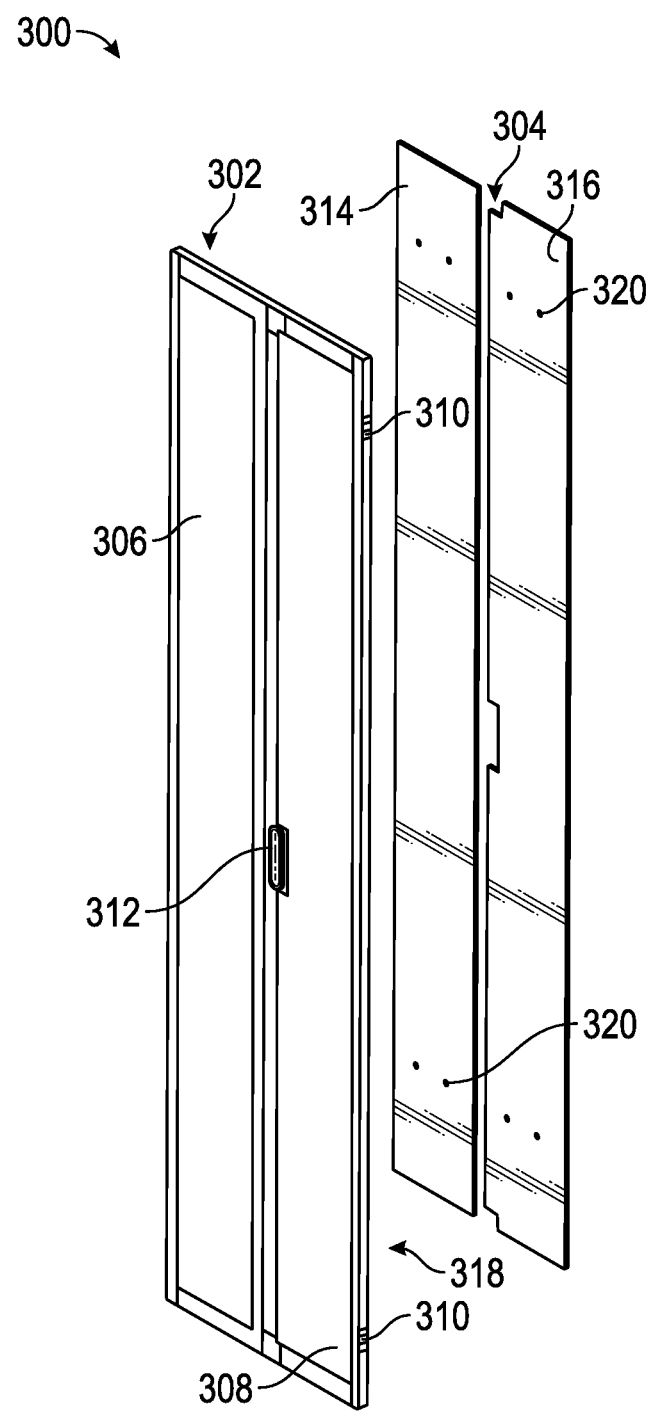
FIG. 10 is an exploded, perspective view of a door assembly of an exemplary equipment cabinet according to the present disclosure.

Turning now to FIG. 10, an exploded, perspective view of an exemplary door assembly 300 is provided. The door assembly 300 can be secured to the frame structure 102 at the front and/or rear of the cabinet 100, e.g., the front vertical frame members 108, 110, the bottom and top front frame members 116, 124, the rear vertical frame members 112, 114, the bottom and top rear frame members 118, 126, combinations thereof, or the like. The door assembly 300 can include a door structure 302 and, in some embodiments, insulation material 304.

Thermal imaging of live data centers have shown that IT cabinets are generally in a state of high temperature and radiate heat into the data center room, thereby contributing to thermal inefficiency. The exemplary door assembly 300 can optionally including the insulation material 304, e.g., expanded polyvinyl chloride (PVC), or the like, that can be secured to the inner surfaces of the door structure 302, allowing the door assembly 300 to act as an insulator. The door assembly 300 can thereby prevent or reduce the amount of heat retained by and radiated from the cabinet 100 due to the heat generated by the IT equipment stored therein. Instead, the heat can be passed through the chimney assembly 138 and out of the cabinet 100.

The door structure 302 can include a first half 306 that can be fixedly (e.g., non-rotatably) secured to the frame structure 102 in a detachable manner. The door structure 302 further includes a second half 308 that can be rotatably secured to the frame structure 102 in a detachable manner. In some embodiments, rather than a two part door structure 302, the door structure 302 can include a single door that is rotatably secured to the frame structure 102. The first half 306 of the door structure 302 can include one or more interlocking mechanisms disposed around the perimeter of the first half 306 to allow interlocking of the first half 306 to the frame structure 102. The second half 308 of the door structure 302 can include two hinges 310 for attachment to the frame structure 102. The door structure 302 further includes a handle 312 including a locking mechanism disposed therein. The locking mechanism allows locking of the second half 308 to the first half 306 such that the second half 308 cannot be opened without the necessary access, e.g., keys.

The insulation material 304 can be configured and dimensioned to correspond to the shape of the respective door structure 302 components. In particular, the insulation material 304 can include a first half 314 and a second half 316. The first half 314 of the insulation material 304 can be shaped complementary to the first half 306 of the door structure 302. The second half 316 of the insulation material 304 can be shaped complementary to the second half 308 of the door structure 302. The first and second halves 314, 316 of the insulation material 304 can be dimensioned slightly smaller than the first and second halves 306, 308 of the door structure 302 such that the first and second halves 314, 316 can fit within the perimeter on the inner surface 318 of the first and second halves 306, 308 of the door structure 302.

In some embodiments, the insulation material 304 can be secured to the door structure 302 with, e.g., screws through openings 320 formed in the insulation material 304, adhesive elements, hook and loop arrangements, or the like. The insulation material 304 can define a substantially planar structure such that when the insulation material 304 is secured to the door structure 302, the space of the enclosure 132 for cable management is not reduced. In some embodiments, the insulation material 304 can also be secured to, e.g., the side panels 266, the top panel 136 (see FIG. 1), combinations thereof, or the like. However, it should be understood that the insulation material 304 can be configured and dimensioned to correspond to the structure of the component on which the insulation material 304 is installed.

The insulation material 304 improves with heat management in the cabinet 100, as well as in data centers having multiple cabinets 100. The insulation material 304 can prevent the cabinet 100 from retaining and radiating heat generated by the equipment secured within the cabinet 100. In particular, the insulation material 304 can be effective in reducing surface temperature and heat radiation from the walls of the cabinet 100, thereby improving the overall thermal efficiency of the cabinet 100 and/or the data center. For example, the insulation material 304 can prevent the steel of the walls of the cabinet 100 from retaining and radiating heat generated by the IT equipment within the cabinet 100, thereby forcing all or the majority of the heat up through the chimney assembly 138 to a computer room air conditioning (CRAC) unit. The transfer of all or the majority of heat up through the chimney assembly 138 raises the return temperature and the overall CRAC efficiency. The outer surfaces of the walls of the cabinet 100 can also remain substantially cool to the touch due to the lack of heat radiated from the IT equipment through the walls of the cabinet 100.

In some embodiments, the insulation material 304 can be in a variety of colors and can be fire rated (e.g., a UL 94 V-0 fire rating or greater). In some embodiments, rather than using preformed insulation material 304, the door assembly 300 can include insulation material applied as a spray on foam. For example, the insulation material can be sprayed on the inner surface of the door structure 302 and any other portions of the cabinet 100.

Figure 11:
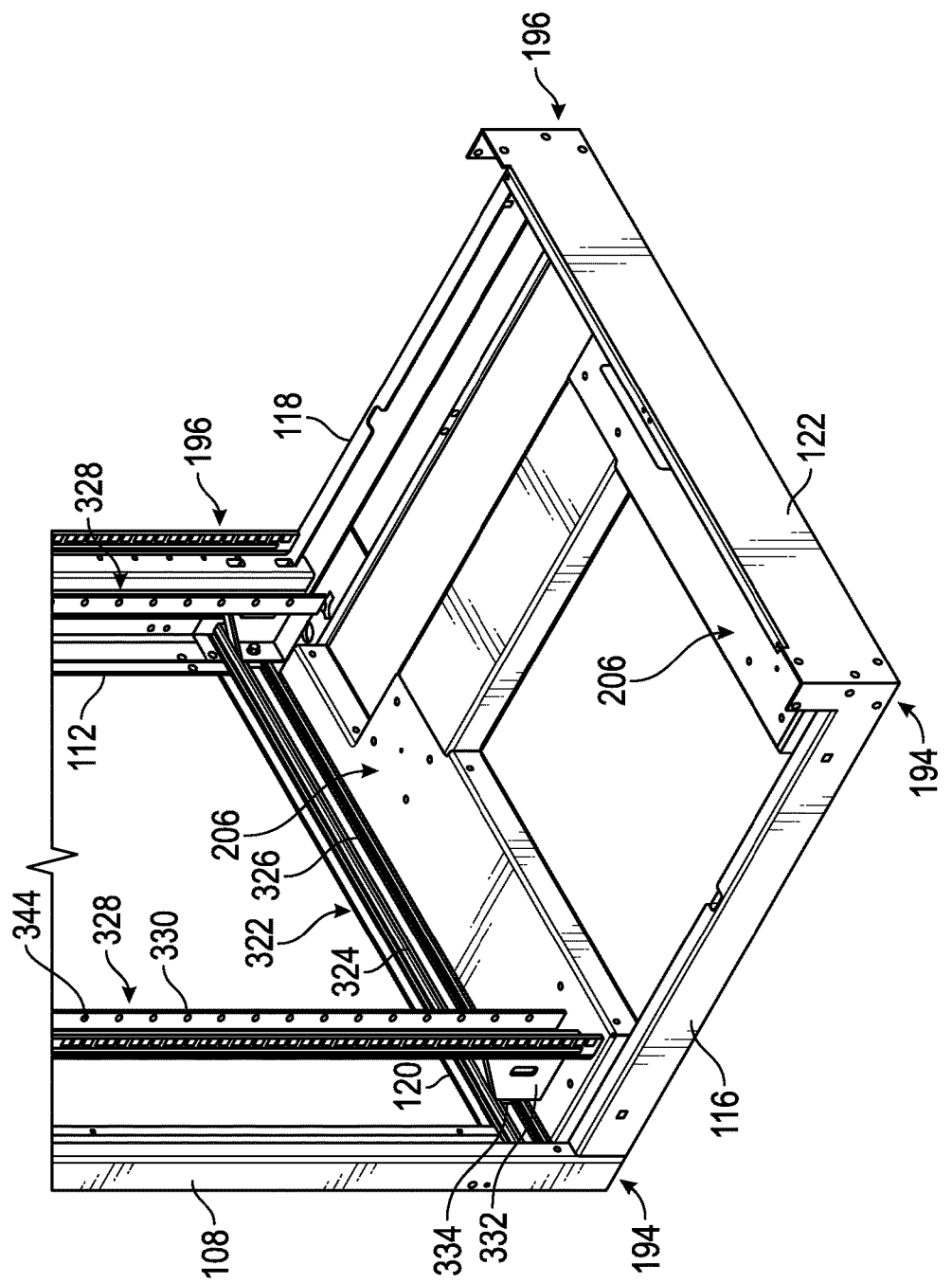
FIG. 11 is a perspective view of a rail assembly of an exemplary equipment cabinet according to the present disclosure.
Figure 12:
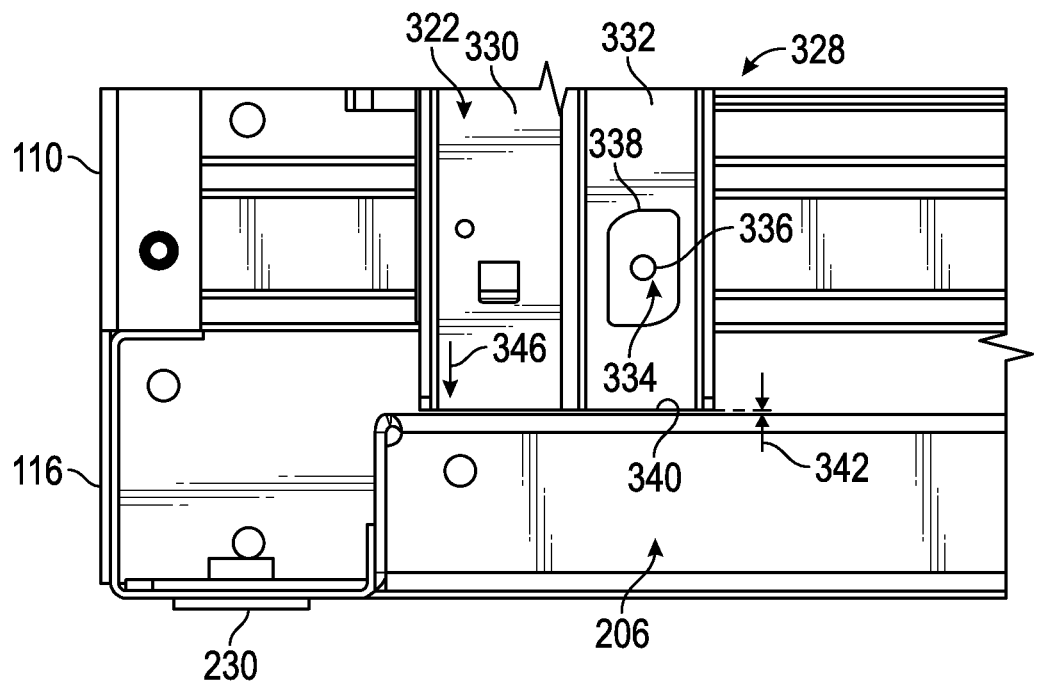
FIG. 12 is a side view of a rail assembly of an exemplary equipment cabinet according to the present disclosure.

Turning now to FIGS. 11 and 12, perspective and side views of an exemplary rail assembly 322 are provided. For clarity, some components of the cabinet 100 have been removed from FIGS. 11 and 12 such that the components of the rail assembly 322 can be seen. The rail assembly 322 includes a pair of horizontal rails 324 disposed on each side of the cabinet 100. In particular, the horizontal rails 324 are fixedly secured to the frame structure 102 along the inner surface of the first and second side bottom frame members 120, 122, respectively, and the inner surface of the first and second side top frame members 128, 130 (see FIG. 16), respectively. Each horizontal rail 324 includes a channel 326 formed therein and extending the length of the horizontal rail 324. In some embodiments, the horizontal rails 324 can be fabricated from steel, e.g., 12 gauge steel, and can be attached, e.g., directly to the frame structure 102 of a twenty-four inch wide cabinet 100, with a bracket to the frame structure 102 of a thirty inch or thirty-two inch wide cabinet 100, or the like. For example, the brackets can attach to top and bottom portions of each horizontal rail 324.

The rail assembly 322 further includes one or more vertical rail assemblies 328 slidably connected to the pair of horizontal rails 324 on each side of the cabinet 100. Each vertical rail assembly 328 includes a vertical rail 330 extending between the top and bottom positioned horizontal rails 324. The vertical rail assembly 328 further includes an angled flange 332 extending from each of the opposing ends of the vertical rail 330. The angled flange 332 includes an extension 336 with a guide 334, e.g., a spring-loaded guide or bearing, disposed at the end. In some embodiments, the extension 336 can be a screw or a threaded member with a bearing at the end. The guide 334 can be configured and dimensioned to be slidably positioned within the channel 326 of the horizontal rail 324. In some embodiments, the guide 334 can define differently curved edges 338 along the perimeter to improve the sliding motion of the guide 334 within the channel 326.

With the top and bottom guides 334 of each vertical rail assembly 328 slidably disposed within the respective channel 326 of the top and bottom horizontal rails 324, when unloaded from IT equipment, the vertical rail assembly 328 can be moved or slid freely from the front to the rear of the cabinet 100 along the horizontal rails 324. In particular, as can be seen in FIG. 12, a bottom surface 340 of the vertical rail assembly 328 can be positioned a distance 342 above the frame structure 102, e.g., the cross member 206. In particular, during the unloaded status of the vertical rail assembly 328 (e.g., when no equipment or equipment below a predetermined weight is mounted on the vertical rail assembly 328), due to the gap distance 342 between the vertical rail assembly 328 and the frame structure 102, the vertical rail assembly 328 can freely slide along the horizontal rails 324. Thus, in the unloaded status of the vertical rail assembly 328, the distance 342 prevents contact between the bottom surface 340 of the vertical rail assembly 328 and the cross member 206. The position of the vertical rail assembly 328 along the horizontal rails 324 can therefore be adjusted and customized based on the needs of the user. In some embodiments, the distance 342 can be approximately 0.031 inches or less above the frame structure 102. In some embodiments, the distance 342 can be approximately 0.187 inches or less above the frame structure 102. In some embodiments, the distance 342 can be between approximately 0.031 inches and approximately 0.187 inches.

When equipment has been mounted to the vertical rail assembly 328 (e.g., at openings 344 formed in the vertical rails 330) exceeding a predetermined weight, the vertical rail assembly 328 can be forced downward along the direction 346 into contact with the frame structure 102. In particular, the weight of the equipment mounted to the vertical rail assembly 328 can force the bottom surface 340 of the vertical rail assembly 328 to come into contact with and abut the cross member 206. In some embodiments, the vertical rail assembly 328 can accommodate a predetermined amount of weight prior to being forced downward along the direction 346 into contact with the frame structure 102, thereby preventing the vertical rail assembly 328 from sliding along the horizontal rails 324. The position of the vertical rail assembly 328 can thereby be adjusted along the horizontal rails 324 while supporting a minimal amount of weight below the predetermined weight limit. In some embodiments, the vertical rail assembly 328 can be forced downward along the direction 346 into contact with the frame structure 102 upon being loaded with any amount of weight, thereby preventing repositioning of the vertical rail assembly 328 unless the weight is removed.

Thus, rather than the vertical rail assembly 328 supporting the weight of the equipment mounted in the cabinet 100, the frame structure 102 (and specifically the cross member 206) provides additional support to the load underneath the vertical rail assembly 328. The ability of the frame structure 102 to support the weight load of the equipment mounted to the vertical rail assembly 328 removes or reduces the vertical shear forces at the junction between the horizontal rails 324 and the frame structure 102. In particular, rather than maintaining the weight of the vertical rail assembly 328 and the equipment on the junction points between the horizontal rails 324 and the frame structure 102, the weight load can be distributed across a greater surface area of the cross member 206.

Although described as being supported by the cross member 206, in some embodiments, alternative beams of the frame structure 102 can be used to support the weight load of the vertical rail assembly 328 and equipment. The ability of the frame structure 102 to support the weight load of the equipment can prevent or reduce deflection of the frame structure 102, the horizontal rails 324, or both, in a populated cabinet 100, thereby increasing the weight load capability of the cabinet 100. The reinforced cabinet 100 can therefore house a greater amount of equipment without incurring damaging effects due to the increased load. It should be understood that to adjust the position of the vertical rail assembly 328 along the horizontal rails 324, the equipment can be removed from the vertical rail assembly 328 and the vertical rail assembly 328 can be slid along the horizontal rails 324 in the desired position.

Figure 13:
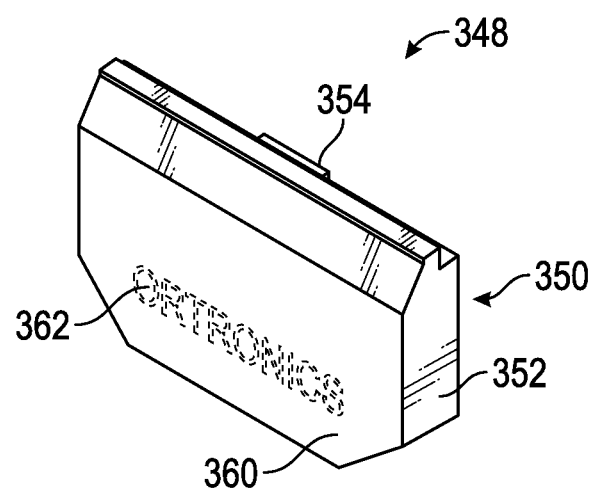
FIG. 13 is a perspective view of a condition monitoring assembly of an exemplary equipment cabinet according to the present disclosure.
Figure 14:
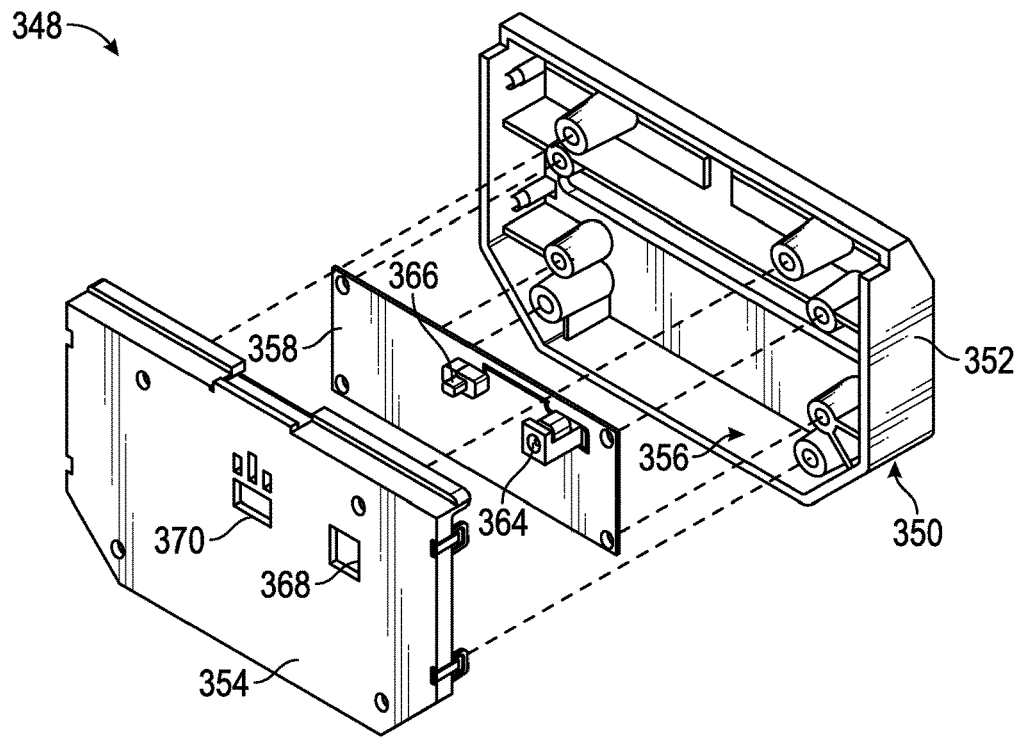
FIG. 14 is an exploded, perspective view of a condition monitoring assembly of an exemplary equipment cabinet according to the present disclosure.

Turning now to FIGS. 13 and 14, perspective and exploded views of an exemplary condition monitoring assembly 348 are provided. In particular, FIG. 13 shows a front perspective view of an assembled condition monitoring assembly 348, and FIG. 14 shows a rear exploded view of the condition monitoring assembly 348. In some embodiments, the condition monitoring assembly 348 can be mounted to an outside surface of the frame structure 102 or to a front door of the cabinet 100 in an area that would be visible to a user. For example, the condition monitoring assembly 348 can be mounted as a pediment on the top front frame member 124 or a front door of the cabinet 100.

The condition monitoring assembly 348 can include a housing 350 including a front cover 352 and a rear cover 354. The housing 350 can be fabricated from, e.g., any polymer(s), sheet metal, or the like. The front cover 352 and the rear cover 354 can be interlocked relative to each other via a snap fit or screws to form an enclosure 356 in which electronic components (such as a printed circuit board (PCB) 358) can be installed. The front cover 352 can include a front surface 360 facing away from the rear cover 354. The front surface 360 can include a logo 362 imprinted or etched thereon.

The PCB 358 can include one or more light emitting members 364 (e.g., a light emitting diode (LED), or the like) thereon for emitting one or more colors of light (e.g., white LED, colored LED, multi-colored LED, LEDs capable of changing colors, or the like). In some embodiments, a single light emitting member 364 can be adapted for emitting different colors of light. The light emitting member 364 can extend from the PCB 358 in the direction away from the front cover 352. In some embodiments, the PCB 358 can include a switch 366 for regulating the status of the condition monitoring assembly 348. The rear cover 354 can include apertures 368, 370 with which the light emitting members 364 and the switch 366 can be aligned when the front cover 352, the rear cover 354, and the PCB 358 are assembled. In particular, the switch 366 and the light emitting member 364 can remain positioned within the enclosure 356 and do not extend from the apertures 368, 370. In some embodiments, the switch 366 can be actuated through the aperture 370 by reaching through the aperture 370 with, e.g., a screwdriver. When the light emitting member 364 is activated into the "ON" position, a light can be emitted from the light emitting member 364 at the rear of the condition monitoring assembly 348.

The PCB 358 can be electrically and communicatively connected (wired, wirelessly, or both) to data center infrastructure management (DCIM), a power distribution unit (PDU), or both. In some embodiments, the PCB 358 can be powered by a self-sensing power supply that is electrically connected to the PDU. In some embodiments, the DCIM can be electronically and communicatively connected (wired, wirelessly, or both) to the PDU. The DCIM can include, e.g., software, hardware, processing devices, a graphical user interface, sensors 372, combinations thereof, or the like. For example, one or more sensors 372 (e.g., temperature, pressure, humidity, combinations thereof, or the like) can be disposed within the enclosure 132 of the cabinet 100 and/or within the chimney assembly 138 (see FIG. 1). Although illustrated in specific positions within the enclosure 132, it should be understood that the sensors 372 can be positioned in alternative locations within the enclosure 132. In particular, the sensors 372 can be positioned within the enclosure 132 to accurately measure, e.g., temperature, pressure, or both, within the enclosure 132 and/or the chimney assembly 138, and send signals to the PCB 358 regarding the measured conditions within the enclosure 132 and/or the chimney assembly 138.

As an example, when the condition monitoring assembly 348 is mounted to the cabinet 100, the rear cover 354 can be positioned adjacent to the cabinet 100 while the front cover 352 faces away from the cabinet 100. Upon receiving signals regarding the measured conditions within the enclosure 132, the PCB 358 can send appropriate signals to the light 366 such that the light 366 can be actuated into an "ON" position in the appropriate color. For example, a green light can represent normal conditions (e.g., temperature and/or pressure within the desired range), an orange light can represent moderate conditions (e.g., temperature and/or pressure above the desired range but below critical values that should be monitored and corrected in the near future), and a red light can represent critical conditions (e.g., temperature and/or pressure above the moderate condition values that require immediate correction). In some embodiments, the condition monitoring assembly 348 can include two or more rows of pads, each row being adapted to receive any color light 366, e.g., LED, or the like. Thus, a variety of light combinations and/or colors can be used to represent the conditions within the enclosure 132.

It should be understood that more than three different colors can be used to represent different conditions within the enclosure 132. In some embodiments, different lights or light combinations can be used to represent temperature and pressure conditions. As the pressure and/or temperature changes within the enclosure 132, the sensors 372 can detect the change and send signals to the PCB 358 for maintaining or changing the light emitted. Real-time conditions within the enclosure 132 can therefore be provided to the user.

In some embodiments, the light emitting member 364 can be actuated to blink in various patterns to represent certain conditions within the enclosure 132. The light from the light emitting member 364 can pass through the aperture 368 and illuminate the rear of the condition monitoring assembly 348, thereby acting as a back light. In particular, the light emitting from the light emitting member 364 can reflect from the cabinet 100 and spread beyond the perimeter of the housing 350 to provide a visual indicator to a user regarding the conditions within the cabinet 100. In some embodiments, the condition monitoring assembly 348 can include an audio indicator to indicate certain conditions within the enclosure 132, e.g., emergency situations, or the like. Although the condition monitoring assembly 348 can be used in combination with a remote monitoring system (e.g., a graphical user interface that provides information on conditions based on signals received from the sensors 372), the visual indicator can provide accurate and immediate information to a user walking through a data center with various cabinets 100 positioned therein. The sensed conditions within the enclosure 132 provide information regarding the measured performance of the cabinet 100, cooling equipment associated with the cabinet 100, or both. Problematic conditions within cabinets 100 can therefore be immediately detected and resolved.

Figure 15:
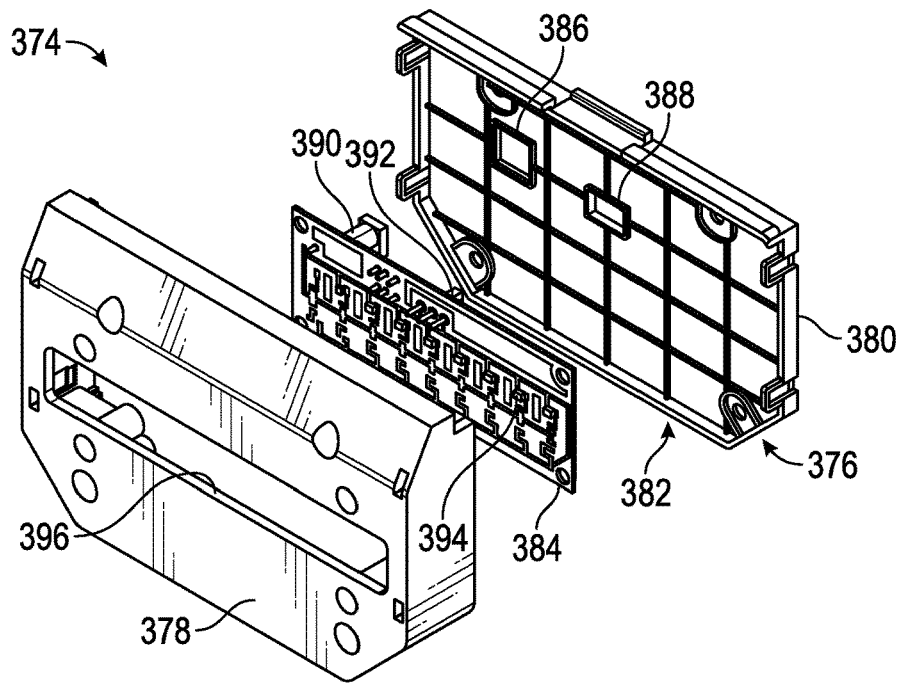
FIG. 15 is an exploded, perspective view of a condition monitoring assembly of an exemplary equipment cabinet according to the present disclosure.

FIG. 15 shows an exploded, perspective view of an alternative exemplary condition monitoring assembly 374. The condition monitoring assembly 374 also includes a housing 376. The housing 376 includes a front cover 378 and a rear cover 380 that can be interlocked to define an enclosure 382 therein. The enclosure 382 can be configured and dimensioned to receive therein a printed circuit board (PCB) 384. As noted above, the PCB 384 can be electrically and communicatively connected (wired, wirelessly, or both) to the DCIM, the PDU, or both.

The rear cover 380 can include apertures 386, 388 configured and dimensioned to allow access to a controller 390 and a switch 392 on the PCB 384, respectively. The PCB 384 can include one or more light emitting members 394 (e.g., LED light(s)) on the side opposing the controller 390 and switch 392. The light emitting members 394 can be adapted to emit a single color, a combination of colors, patterns of emitting light, changes in colors, or the like, based on signals received by the PCB 384 from the sensors 372 disposed within the enclosure 132. The front cover 378 includes a display 396 formed therein. The display 396 can be aligned with the row of light emitting members 394 on the PCB 384 such that one or more light emitting members 394 actuated into the "ON" position can be clearly visible through the display 396.

In some embodiments, the display 396 can be in the form of a window cut out of the front cover 378 including a transparent or translucent cover to protect the PCB 384. In some embodiments, the display 396 can be in the form of a transparent or translucent portion of the material forming the front cover 378. In some embodiments, the display 396 can be in the form of one or more apertures formed in the front cover 378, each of the apertures being aligned with the respective light emitting members 394. In some embodiments, the sensors 372 can send signals to the PCB 384 on a scheduled basis, e.g., every thirty seconds, every minute, every five minutes, every ten minutes, every thirty minutes, or the like. Similar to the condition monitoring assembly 348, the condition monitoring assembly 374 can provide a substantially real-time visual indication of the conditions within the enclosure 132 based on the signals received from the sensors 372.

Turning now to FIGS. 16-23, perspective and top views of the top frame assembly 106 with an exemplary top panel 136 are provided in disassembled, partially assembled, and assembled configurations. For clarity, some components of the cabinet 100 have been removed to assist in visualizing the complementary components of the top frame assembly 106 and the top panel 136.

Cable entry or egress through the top panel 136 can be variable and dependent on the application of the cabinet 100. For example, server applications can require openings in the rear of the cabinet 100, while network applications can require openings in the front of the cabinet 100. If patching of cables is necessary, cabling is traditionally routed to the front and then to the rear of the patch panels in the cabinet 100, resulting in tension at the termination point and introducing a potential failure point in the network. Custom top panels are therefore traditionally required based on the application.

In contrast, as will be described in greater detail below, the exemplary top panel 136 can be attached to and removed from the frame structure 102 without additional tools, and can be rotated 180 degrees to customize the cabinet 100 for various cable management applications. The variable positioning of the top panel 136 provides greater functionality for cable entry or egress, resulting in improved cable management. The improved cable management can remove or reduce stress in the connection point of the network and improves network performance by removing the tight bend radius and potential failure points associated with traditional cable management panels. Although illustrated as including a single top panel 136 extending across substantially half of the depth of the cabinet 100, in some embodiments, the cabinet 100 can include two top panels 136 adjacently positioned to cover substantially all of the top surface of the cabinet 100.

Figure 16:
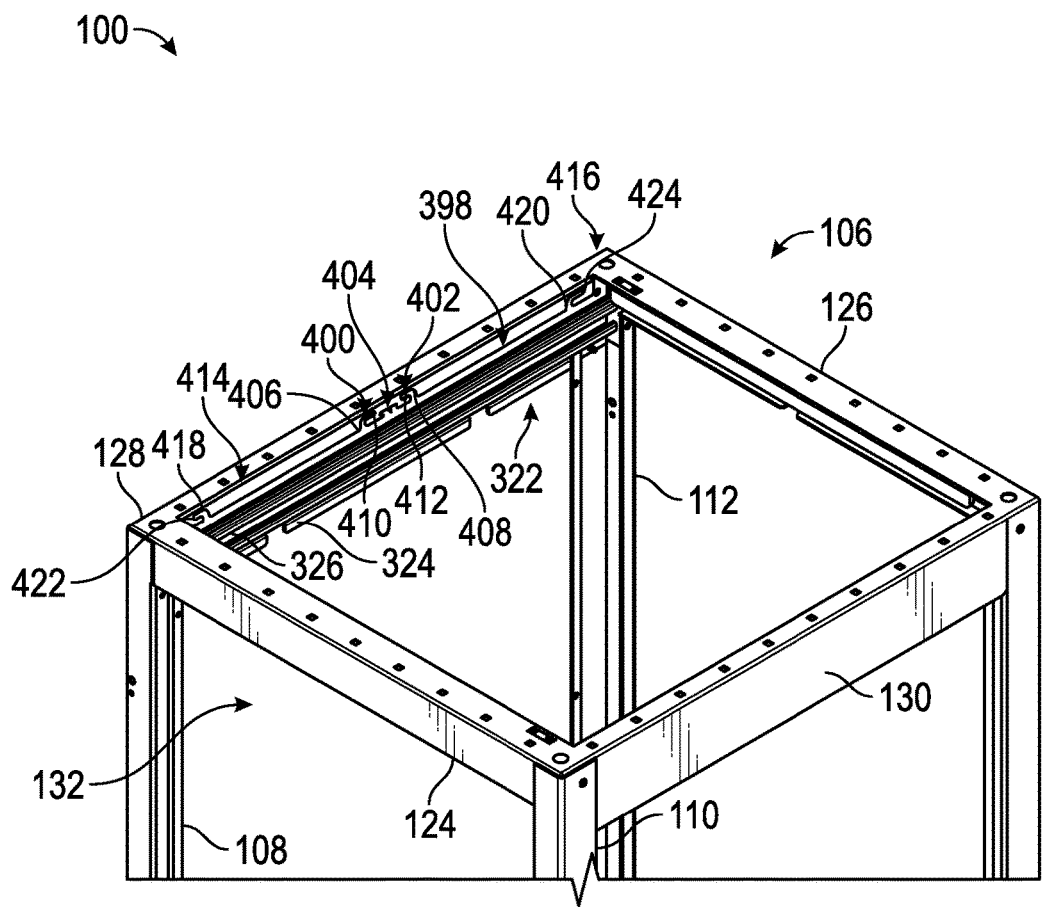
FIG. 16 is a perspective view of a top frame assembly of an exemplary equipment cabinet according to the present disclosure.

With respect to FIG. 16, a perspective view of the top frame assembly 106 is provided. As noted previously, the top frame assembly 106 includes the horizontal rail 324 of the rail assembly 322 secured to the inner surface of the first side top frame member 128 between the front and rear top frame members 124, 126. A similar horizontal rail 324 can be secured to the inner surface of the second side top frame member 130 between the front and rear top frame members 124, 126. The inner surface of the first and second side top frame members 128, 130 includes an interlocking frame section 398. In some embodiments, the interlocking frame section 398 can be formed directly in the first and second side top frame members 128, 130. In some embodiments, the interlocking frame section 398 can be formed separately from the first and second side top frame members 128 and can be secured to the respective first and second side top frame members 128 by, e.g., fasteners, welding, or the like.

The interlocking frame section 398 is disposed above the horizontal rail 324. In particular, the bottom edge of the interlocking frame section 398 can be adjacent or spaced from the horizontal rail 324 and the top edge of the interlocking frame section 398 does not extend beyond the plane defined by the top of the top frame assembly 106. The interlocking frame section 398 includes a first central guide 400 and a second central guide 402 (e.g., hook-shaped or L-shaped slots or passages) in a spaced and opposing relation at a central portion 404 of the interlocking frame section 398. Each of the first and second central guides 400, 402 includes an inlet end 406, 408 at or near the bottom edge of the interlocking frame section 398, and an inner endpoint 410, 412. The inlet ends 406, 408 can face in a downward direction and each of the first and second central guides 400, 402 can extend in the direction of the central portion 404. Thus, the first and second central guides 400, 402 extend towards each other and remain in spaced relation. As will be discussed in greater detail below, the first and second central guides 400, 402 can be configured and dimensioned to receive a pin of the top panel 136 therein.

The interlocking frame section 398 further includes a first endpoint guide 414 disposed in a spaced relation from one endpoint of the interlocking frame section 398, and a second endpoint guide 416 disposed in a spaced relation from an opposing endpoint of the interlocking frame section 398. Each of the first and second endpoint guides 414, 416 includes an inlet end 418, 420 at or near the bottom edge of the interlocking frame section 398, and an inner endpoint 422, 424. The inlet ends 418, 420 can extend and face in a downward direction, and the inner endpoints 422, 424 can extend away from each other, e.g., in a direction away from the central portion 404. As will be discussed in greater detail below, the first and second endpoint guides 414, 416 can be configured and dimensioned to receive a pin of the top panel 136 therein.

Figure 17:
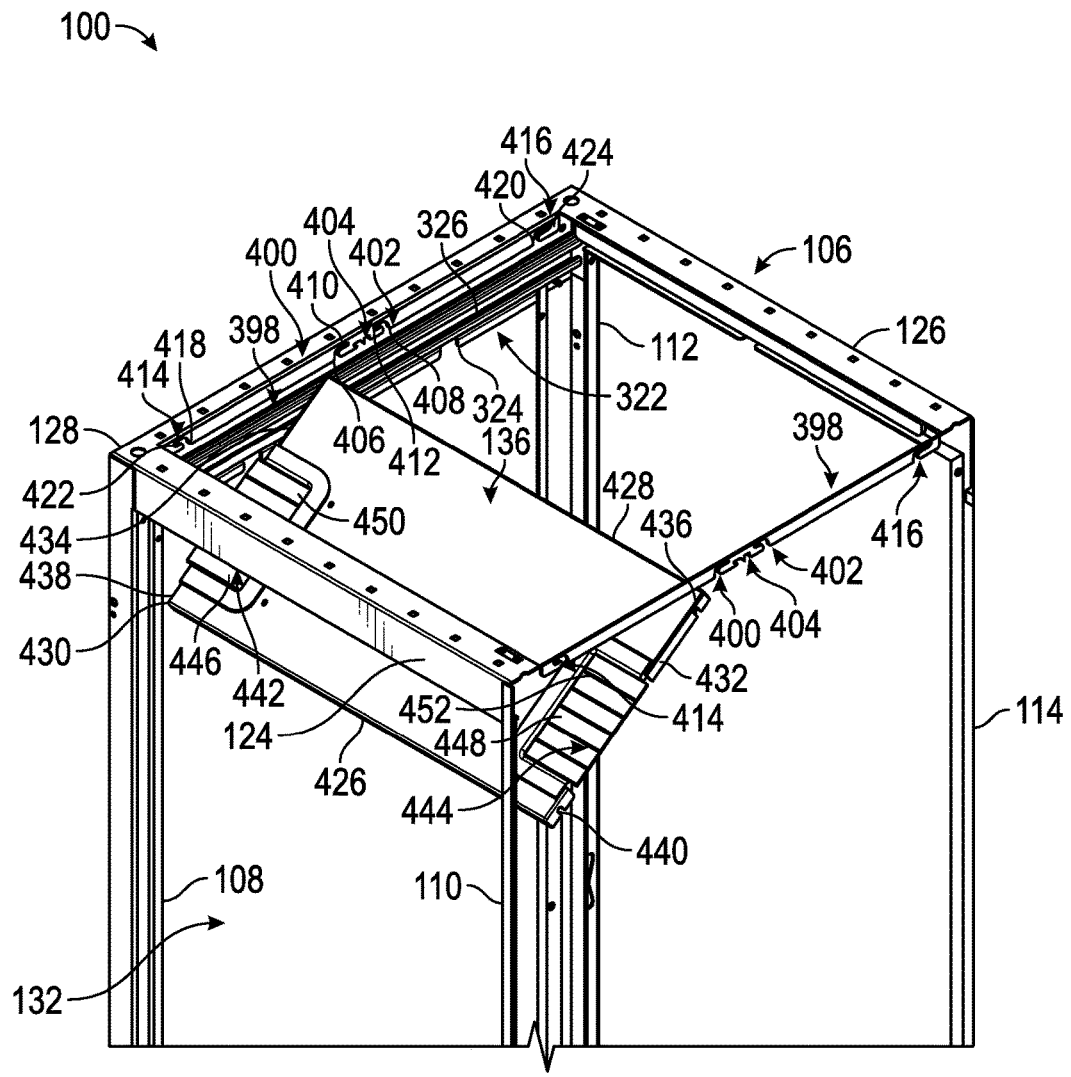
FIG. 17 is a perspective view of a top frame assembly with a top panel of an exemplary equipment cabinet in a disassembled configuration according to the present disclosure.

With reference to FIG. 17, a perspective view of the top frame assembly 106 and the top panel 136 in a disassembled configuration is provided. It is noted that the second side top frame member 130 has been removed for visibility of both of the interlocking frame sections 398. The top panel 136 defines a depth substantially equal to approximately half of the depth of the top frame assembly 106 (e.g., an opening defined by the top frame assembly 106), and further defines a width substantially equal to the width of the top frame assembly 106. In some embodiments, the top panel 136 can define a depth substantially equal to the depth of the top frame assembly 106 (e.g., the opening defined by the top frame assembly 106) such that the top panel 136 can cover the entire opening of the top frame assembly 106. In some embodiments, the top frame assembly 106 can be covered by two or more top panels 136. The top panel 136 can define a substantially planar form. In some embodiments, the top panel 136 can be fabricated from steel. In some embodiments, the top panel 136 can include insulation material attached to an inner surface.

The perimeter of the top panel 136 includes an outer edge 426, an inner edge 428, a first side edge 430, and a second side edge 432. The top panel 136 includes a pin 434, 436 formed on the first and second side edges 430, 432 and spaced from the inner edge 428. In particular, the pins 434, 436 can be disposed near the intersection of the inner edge 428 and the respective first and second side edges 430, 432. The pins 434, 436 can protrude outwardly beyond the edge of the first and second side edges 430, 432 and can be configured and dimensioned to pass through the first and second central guides 400 of the interlocking frame sections 398. The pins 434, 436 can be solid pins, e.g., not spring-loaded or depressible.

The top panel 136 further includes a pin 438, 440 formed on the first and second side edges 430, 432 and spaced from the outer edge 426. In particular, the pins 438, 440 can be disposed near the intersection of the outer edge 426 and the respective first and second side edges 430, 432. The pins 438, 440 can protrude outwardly beyond the edge of the first and second side edges 430, 432 and can be configured and dimensioned to pass through the first and second endpoint guides 414 of the interlocking frame sections 398. The pins 438, 440 can be spring-loaded such that the pins 438, 440 can be depressed into the body of the top panel 136 and, upon release, automatically extend outwardly from the first and second side edges 430, 432.

In some embodiments, the top panel 136 can include a grommet 442, 444 formed on each of the first and second side edges 430, 432 and extending into the body of the top panel 136. The grommets 442, 444 can include a webbing of elongated members 446, 448, e.g., fingers, extending in directions parallel to the inner and outer edges 428, 426 of the top plate 136. The elongated members 446, 448 can be separated by perforations 450, 452. The edges of the elongated members 446, 448 can extend beyond the perimeter of the first and second edges 430, 432 such that when the top panel 136 is interlocked relative to the top frame assembly 106, the edges of the elongated members 446, 448 can rest on top of the top frame assembly 106, e.g., the first and second side top frame members 128, 130, to prevent sagging of the grommet 136.

The elongated members 446, 448 can be individually separated from the top panel 136 at the perforations 450, 452 to allow for passage of cables through the grommet 442, 444 and into the enclosure 132. The ability to individually separate the elongated members 446, 448 allows for customization of the opening in the top panel 136 based on the differently sized cable bundles to be used, while simultaneously maintaining a substantially tight seal of the passage in the top panel 136. In some embodiments, the grommets 442, 444 can be molded from a soft durometer material that facilitates airflow therethrough while preventing particulates from entering the enclosure 132 of the cabinet 100.

Figure 18:
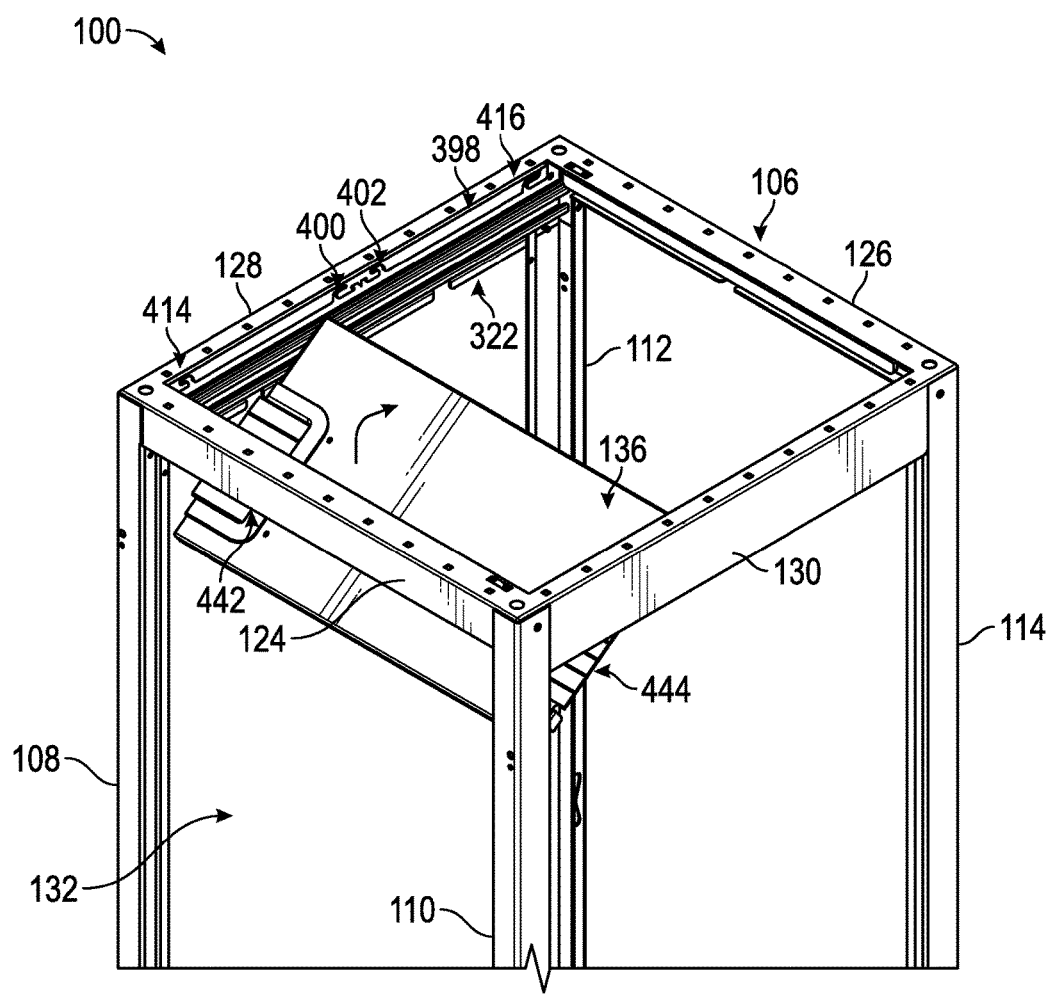
FIG. 18 is a perspective view of a top frame assembly with a top panel of an exemplary equipment cabinet in a disassembled configuration according to the present disclosure.
Figure 19:
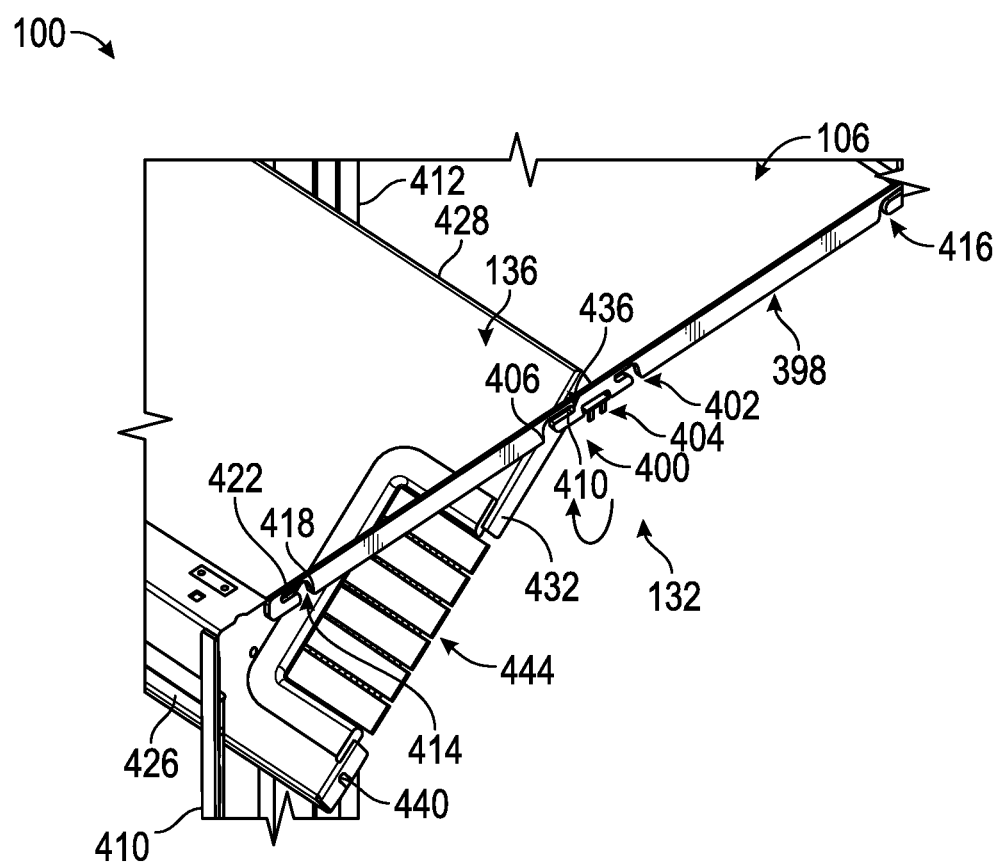
FIG. 19 is a perspective view of a top frame assembly with a top panel of an exemplary equipment cabinet in a partially assembled configuration according to the present disclosure.
Figure 20:
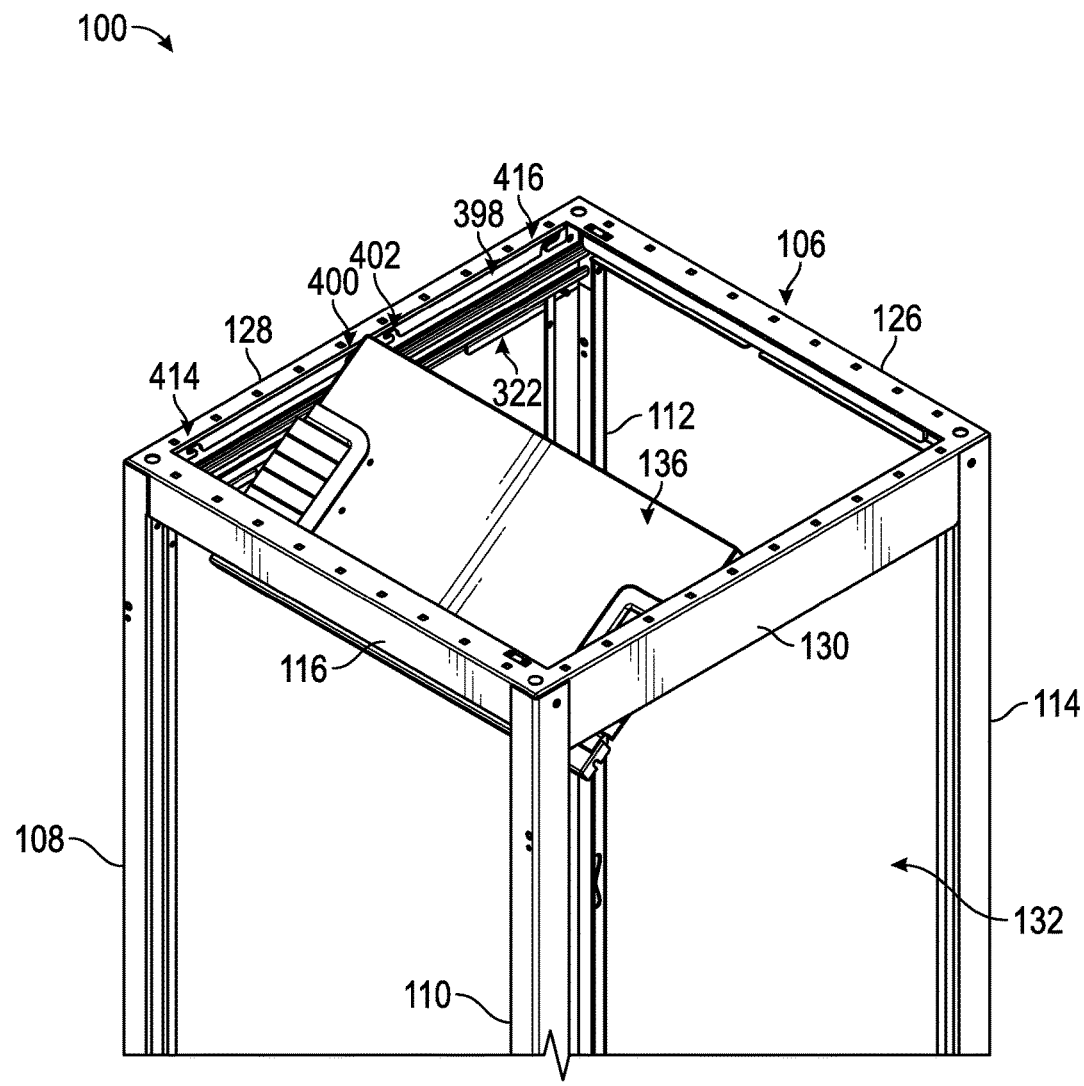
FIG. 20 is a perspective view of a top frame assembly with a top panel of an exemplary equipment cabinet in a partially assembled configuration according to the present disclosure.

FIGS. 18-20 show the initial steps for interlocking the top panel 136 with the top frame assembly 106 and, in particular, with the interlocking frame sections 398. Although illustrated as being interlocked relative to a front half of the top frame assembly 106 (e.g., first central and endpoint guides 400, 414), it should be understood that the top panel 136 can be rotated approximately 180 degrees and interlocked relative to a rear half of the top frame assembly 106 (second central and endpoint guides 402, 416).

From within the enclosure 132, the pins 434, 436 can be passed into the first central guides 404 through the inlet ends 406 of the interlocking frame sections 398 on either side of the top frame assembly 106. The pins 434, 436 can be pushed through the first central guides 404 up to the inner endpoints 410. While positioned within the inner endpoints 410 of the first central guides 404, the pins 434, 436 can act as hinges about which the top plate 136 can rotate.

Figure 21:
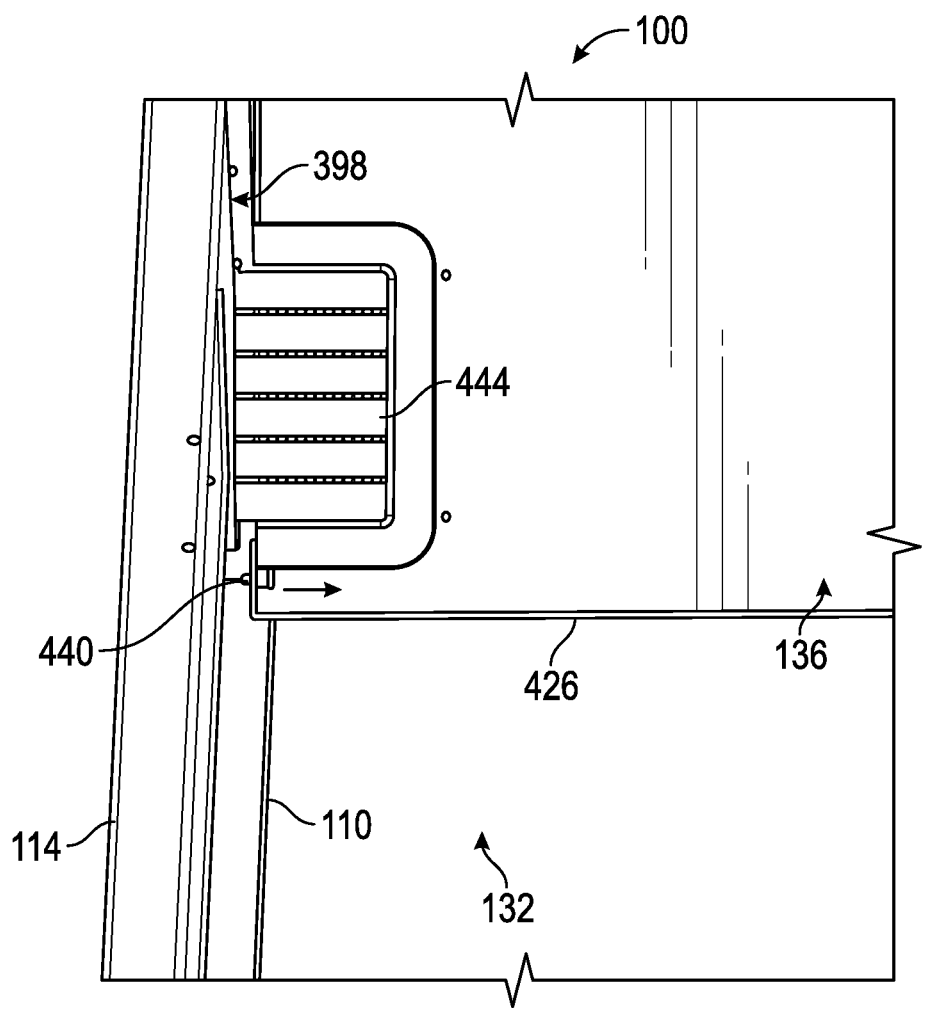
FIG. 21 is a bottom, perspective view of a top frame assembly with a top panel of an exemplary equipment cabinet in a partially assembled configuration according to the present disclosure.
Figure 22:
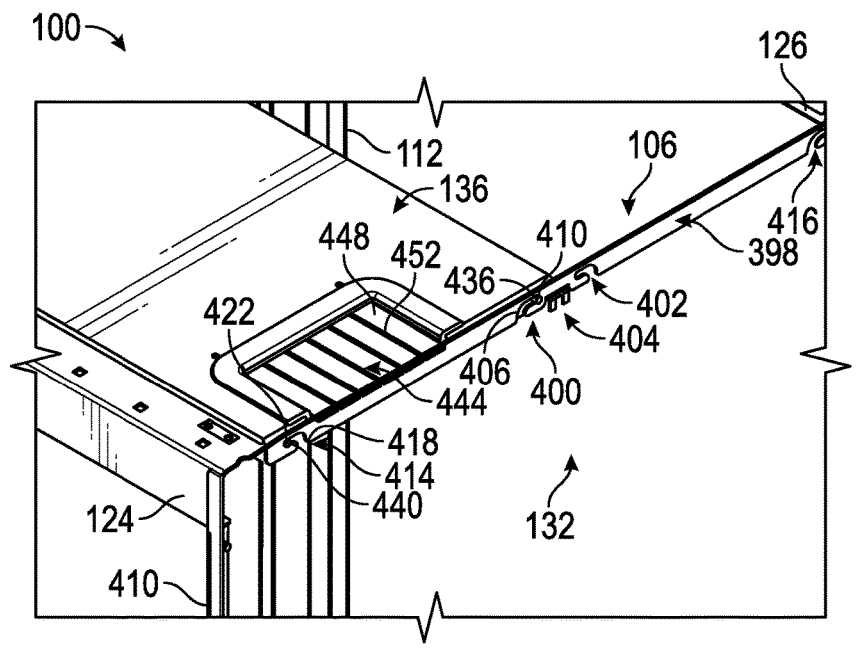
FIG. 22 is a perspective view of a top frame assembly with a top panel of an exemplary equipment cabinet in an assembled configuration according to the present disclosure.

With reference to FIGS. 21 and 22, the pins 438, 440 can be depressed and the top panel 136 can be rotated to substantially align with the plane defined by the top frame assembly 106. In addition, the top panel 136 can be rotated to align the pins 438, 440 with the first endpoint guides 414 on opposing sides of the top frame assembly 106. Upon release of the pins 438, 440, the pins 438, 440 can extend outwardly and into the inner endpoints 422 of the first endpoint guides 414. The position of the pins 434, 436, 438, 440 within the inner endpoints 410, 422 of the first central and endpoint guides 400, 414 prevents movement of the top panel 136.

Figure 23:
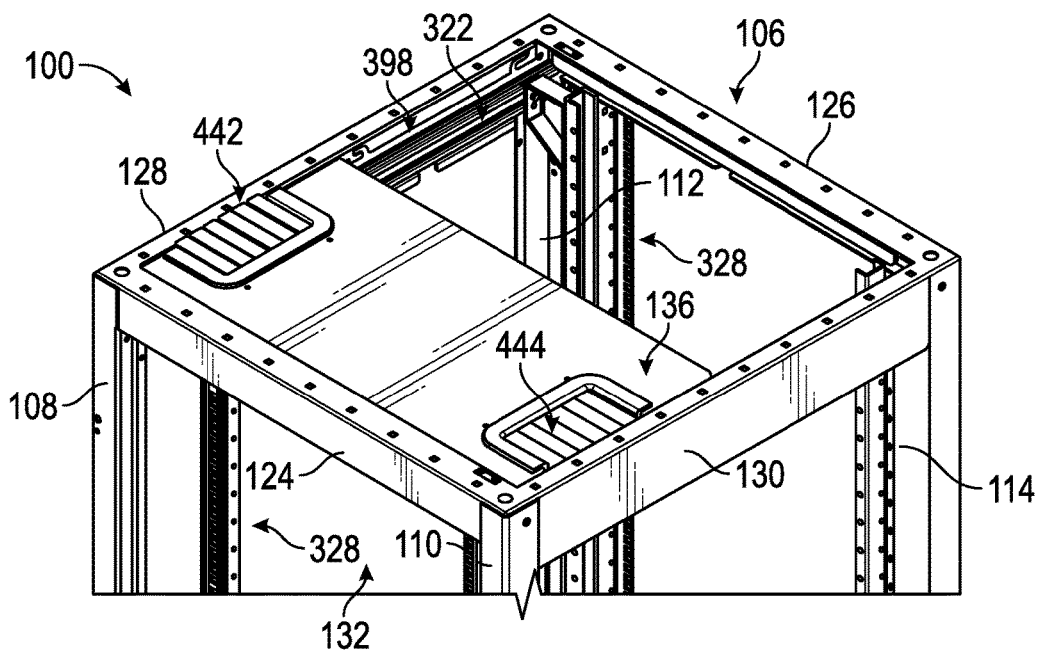
FIG. 23 is a perspective view of a top frame assembly with a top panel of an exemplary equipment cabinet in an assembled configuration according to the present disclosure.

FIG. 23 shows the top panel 136 in a fully interlocked configuration relative to the top frame assembly 106. In particular, the top panel 136 is detachably interlocked relative to the top frame assembly 106 and covers approximately half of the opening formed by the top frame assembly 106. The endpoints of the elongated members 444 can be configured to rest on top of the top frame assembly 106 to prevent sagging of the top panel 136. Specifically, the top frame assembly 106 can provide support to the top panel 136. Positioning of the elongated members 448 on top of the top frame assembly 106 can further ensure a substantially air-tight seal between the top panel 136 and the top frame assembly 106, thereby improving airflow management within the cabinet 100. To remove the top panel 136 from the top frame assembly 106, the pins 438, 440 can be depressed, the top panel 136 can be swung downward and out of the first endpoint guides 414, and the pins 434, 436 can be slid out of the first central guides 400.

As noted above, the position of the top panel 136 can be customized based on the needs of the user. For example, the top panel 136 can be unlocked from the front half of the top frame assembly 106, rotated approximately 180 degrees, and interlocked with the rear half of the top frame assembly 106, thereby maintaining an open passage into the enclosure through the top frame assembly 106. The assembly and disassembly of the top panel 136 relative to the top frame assembly 106 can therefore be performed without additional tools and allows for convenient customization of the cabinet 100.

In particular, the versatility of the position of the top panel 136 provides the ability to have cabling enter the enclosure 132 towards the center of the cabinet 100 for network applications. The customizable top panel 136 also allows cabling to enter the enclosure 132 behind patch panels in the cabinet 100 for terminating. The ability to customize openings into the enclosure 132 from the top frame assembly 106 removes the tension created by tight bend radii at the connection points (e.g., potential failure points) generally associated with cables entering the front of the cabinet 100 and being routed behind the patch panels. The top panel 136 advantageously allows bringing large bundles of cabling into the cabinet 100 at various locations in the top panel 136 by moving the opening for the cables without creating a custom top panel 136. In particular, rather than creating a custom top panel 136 with the desired openings for cables, the top panel 136 can be moved and/or the elongated members 444 can be removed to create the desired openings in the same top panel 136. The top panel 136 can therefore be customized to provide advantageous cable entry or egress, resulting in improved cable management.

The exemplary cabinet 100 and associated components discussed herein therefore provide a means to customize the cabinet 100 for a variety of user needs. The cabinet 100 further includes features that improve airflow within the cabinet and improve cable management capabilities. The advantageous variability of the cabinet 100 provides the ability to manage a large number of cables within the cabinet 100, while maintaining the desired conditions within the cabinet 100.

Although the equipment cabinets and methods of the present disclosure have been described with reference to exemplary embodiments thereof, the present disclosure is not limited to such exemplary embodiments and/or implementations. Rather, the equipment cabinets and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

The invention claimed is:

1. An equipment cabinet, comprising:
   a frame structure, the frame structure including a top frame assembly and a bottom frame assembly;
   a chimney assembly, the chimney assembly including a first section and a second section that define a passage therethrough, the first section of the chimney assembly including a vertical guide defining a vertical channel formed in the first section and extending along a height of the first section;
   a nut slidably disposed within the vertical channel formed in the first section; and
   a fastener configured to mate with the nut of the first section to: (i) attach the nut within the vertical channel, and (ii) maintain a position of the second section relative to the first section;
   wherein the first section of the chimney assembly is mountable to the top frame assembly of the frame structure;
   wherein the second section is slidably movable relative to the first section to extend the passage formed by the first and second sections of the chimney assembly; and
   wherein the nut is configured and dimensioned so that loosening the fastener with respect to the nut allows movement of the second section of the chimney assembly via movement of the nut within the vertical channel while the nut remains mounted to the fastener, and tightening the fastener with respect to the nut engages the nut within the vertical channel to prevent movement of the second section of the chimney assembly.

2. The equipment cabinet of claim 1, wherein the chimney assembly comprises a base section, the first section being mountable to the top frame assembly with the base section.

3. The equipment cabinet of claim 1, wherein the fastener includes a threaded extension, the threaded extension configured to be positioned within a threaded opening of the nut.

4. The equipment cabinet of claim 3, wherein the second section of the chimney assembly includes a front wall, the front wall having an opening formed therein and configured to receive therethrough the threaded extension of the fastener.

5. The equipment cabinet of claim 4, wherein the opening is formed in the front wall in a position offset from a bottom surface of the second section of the chimney assembly.

6. The equipment cabinet of claim 1, wherein the second section of the chimney assembly is concentrically disposed over the first section of the chimney assembly.

7. The equipment cabinet of claim 1, comprising a divider panel configured to be detachably secured to the frame structure to separate an enclosure formed by the frame structure, the divider panel including a vertical joint along which the divider panel can be split.

8. The equipment cabinet of claim 1, comprising a divider panel configured to be detachably secured to the frame structure to separate an enclosure formed by the frame structure, the divider panel including a horizontal joint along which the divider panel can be split.

9. The equipment cabinet of claim 1, comprising an airflow baffle disposed at or near the bottom frame assembly configured to guide airflow into the passage formed by the first and second sections of the chimney assembly.

10. The equipment cabinet of claim 1, comprising (i) horizontal rails mounted to the top frame assembly and the bottom frame assembly, and (ii) a vertical rail assembly mechanically connected to the horizontal rails, wherein the vertical rail assembly is slidable along the horizontal rails in an unloaded configuration, and wherein upon being loaded, the vertical rail assembly is automatically prevented from sliding along the horizontal rails.

11. The equipment cabinet of claim 1, comprising (i) interlocking frame sections formed in or mounted to the top frame assembly, and (ii) a top panel configured and dimensioned to detachably interlock to the interlocking frame sections, wherein in a first configuration, the top panel is positioned in a first orientation and detachably interlocks with the interlocking frame sections to cover a first half of an opening formed by the top frame assembly, and wherein in a second configuration, the top panel is rotated from the first orientation into a second orientation and detachably interlocks with the interlocking frame sections to cover a second half of the opening formed by the top frame assembly.

12. The equipment cabinet of claim 1, wherein the second section of the chimney assembly includes a handle extending at an angle from a bottom edge of the second section, the handle configured to assist a user in sliding the second section along a vertical direction relative to the first section.

13. A method of equipment cabinet assembly, comprising:
    providing an equipment cabinet, the equipment cabinet including (i) a frame structure, the frame structure including a top frame assembly and a bottom frame assembly, and (ii) a chimney assembly, the chimney assembly including a first section and a second section that define a passage therethrough, the first section of the chimney assembly including a vertical guide defining a vertical channel formed in the first section and extending along a height of the first section;
    mounting the first section of the chimney assembly to the top frame assembly of the frame structure;
    positioning a nut slidably disposed within the vertical channel formed in the first section; and
    mating a fastener with the nut of the first section to: (i) attach the nut within the vertical channel, and (ii) maintain a position of the second section relative to the first section;
    slidably moving the second section relative to the first section to extend the passage formed by the first and second sections of the chimney assembly;
    wherein the nut is configured and dimensioned so that loosening the fastener with respect to the nut allows movement of the second section of the chimney assembly via movement of the nut within the vertical channel while the nut remains mounted to the fastener, and tightening the fastener with respect to the nut engages the nut within the vertical channel to prevent movement of the second section of the chimney assembly.

14. The method of claim 13, comprising concentrically positioning the second section relative to the first section of the chimney assembly.

15. The method of claim 13, wherein the fastener includes a threaded extension, the threaded extension configured to be positioned within a threaded opening of the nut;
    wherein the second section of the chimney assembly includes a front wall, the front wall having an opening formed therein and configured to receive therethrough the threaded extension of the fastener; and wherein the opening is formed in the front wall in a position offset from a bottom surface of the second section of the chimney assembly.

16. The method of claim 13, wherein the second section of the chimney assembly includes a handle extending at an angle from a bottom edge of the second section, the handle configured to assist a user in sliding the second section along a vertical direction relative to the first section.

* * * * *